US008763750B1

(12) United States Patent
Berkman et al.

(10) Patent No.: US 8,763,750 B1
(45) Date of Patent: Jul. 1, 2014

(54) AUDIO EQUIPPED FAN

(71) Applicant: Homewerks Worldwide, LLC, Lincolnshire, IL (US)

(72) Inventors: Peter D. Berkman, Highland Park, IL (US); Ruilin Zhang, Foshan (CN); Jeffrey Jon Pischke, Cary, IL (US); Michael Malaker, Gurnee, IL (US)

(73) Assignee: Homewerks Worldwide, LLC, Lincolnshire, IL (US)

(*) Notice: Subject to any disclaimer, the term of this patent is extended or adjusted under 35 U.S.C. 154(b) by 0 days.

(21) Appl. No.: 14/043,581

(22) Filed: Oct. 1, 2013

Related U.S. Application Data

(63) Continuation of application No. 13/962,625, filed on Aug. 8, 2013.

(60) Provisional application No. 61/799,140, filed on Mar. 15, 2013, provisional application No. 61/745,560, filed on Dec. 22, 2012.

(51) Int. Cl.

| | |
|---|---|
| ***H05K 5/02*** | (2006.01) |
| ***F24F 13/20*** | (2006.01) |
| ***F24F 7/02*** | (2006.01) |
| ***H04R 1/02*** | (2006.01) |
| *H05K 5/00* | (2006.01) |
| *F24F 13/00* | (2006.01) |
| *F24F 7/00* | (2006.01) |

(52) U.S. Cl.
CPC .................................... *H04R 1/021* (2013.01)
USPC ........................... 181/150; 181/199; 454/248

(58) Field of Classification Search
CPC .... H04R 1/028; H04R 1/02; H04R 2201/021; H04R 2201/02; F24F 13/08; F24F 13/20; F24F 7/02; F24F 13/078; F21V 33/0096; F21V 33/0088
USPC ........... 181/150, 149, 199, 206; 454/248, 241
See application file for complete search history.

(56) References Cited

U.S. PATENT DOCUMENTS

| | | | | | |
|---|---|---|---|---|---|
| 2,010,322 | A * | 8/1935 | Riddell | ......................... | 454/293 |
| 2,924,661 | A * | 2/1960 | Messeas, Jr. | .................. | 381/388 |
| 2,966,550 | A * | 12/1960 | Golberg et al. | ............... | 381/336 |

(Continued)

FOREIGN PATENT DOCUMENTS

| | | |
|---|---|---|
| CA | 2471905 A1 * | 7/2003 |
| JP | 4-20670 | 1/1992 |

(Continued)

*Primary Examiner* — Edgardo San Martin
(74) *Attorney, Agent, or Firm* — Fitch, Even, Tabin & Flannery, LLP

(57) ABSTRACT

An audio equipped fan is disclosed having a housing defining an inner cavity, a motor disposed at least partially in the inner cavity of the housing and having an output shaft extending therefrom that is rotatable by the motor, a fan connected to the output shaft of the motor and rotatable therewith, a grille connected to the housing and positioned in alignment with the fan, the grille having an interior side and an exterior side and defining first openings through which air may flow while the fan is rotated and second openings through which sound may travel, and having a speaker connected to at least one of the housing, motor, fan and grille and aligned on the interior side of the grille with the second openings of the grille so that sound may travel from the speaker through the grille. Related methods are also disclosed.

30 Claims, 14 Drawing Sheets

(56) References Cited

U.S. PATENT DOCUMENTS

| | | | | |
|---|---|---|---|---|
| 4,322,632 | A | 3/1982 | Hart et al. | |
| 4,382,400 | A | 5/1983 | Stutzman | |
| 4,671,284 | A * | 6/1987 | Wilson et al. | 607/81 |
| 4,716,409 | A | 12/1987 | Hart et al. | |
| 5,448,495 | A * | 9/1995 | Liu | 361/679.58 |
| 5,664,872 | A * | 9/1997 | Spearman et al. | 362/96 |
| 5,884,694 | A * | 3/1999 | Tanenbaum | 165/125 |
| 5,934,783 | A * | 8/1999 | Yoshikawa | 362/96 |
| 5,980,057 | A * | 11/1999 | Christie | 362/86 |
| 6,215,885 | B1 * | 4/2001 | Geiger | 381/386 |
| 6,321,869 | B1 * | 11/2001 | Park | 181/199 |
| 6,601,247 | B2 | 8/2003 | Shimizu | |
| 7,380,292 | B1 | 6/2008 | Harris | |
| 7,553,039 | B2 | 6/2009 | Harris et al. | |
| 7,606,379 | B2 * | 10/2009 | Ivey et al. | 381/160 |
| 7,607,935 | B2 * | 10/2009 | Dahl | 439/485 |
| 7,683,777 | B2 | 3/2010 | Macaluso et al. | |
| 7,862,194 | B2 | 1/2011 | Seade | |
| 7,881,656 | B2 | 2/2011 | Khedouri et al. | |
| 8,042,961 | B2 * | 10/2011 | Massara et al. | 362/86 |
| 8,218,805 | B2 * | 7/2012 | Hornback | 381/333 |
| 8,297,402 | B2 * | 10/2012 | Stewart et al. | 181/152 |
| 8,300,869 | B2 * | 10/2012 | Marlin et al. | 381/340 |
| 8,365,861 | B2 * | 2/2013 | Massini et al. | 181/206 |
| 8,434,916 | B2 * | 5/2013 | Craw et al. | 362/373 |
| 8,485,696 | B2 * | 7/2013 | Pringle et al. | 362/373 |
| 2004/0107271 | A1 | 6/2004 | Ahn et al. | |
| 2005/0186993 | A1 | 8/2005 | Yueh | |
| 2005/0286546 | A1 | 12/2005 | Bassoli et al. | |
| 2006/0262949 | A1 | 11/2006 | Cho et al. | |
| 2007/0092088 | A1 | 4/2007 | Chang | |
| 2008/0109550 | A1 | 5/2008 | Tedesco et al. | |
| 2008/0226112 | A1 | 9/2008 | Lin | |
| 2010/0127607 | A1 | 5/2010 | Harris | |
| 2010/0190607 | A1 | 7/2010 | Widerman et al. | |
| 2010/0199413 | A1 | 8/2010 | Pollack et al. | |
| 2010/0308657 | A1 | 12/2010 | Bucher | |
| 2011/0047686 | A1 | 3/2011 | Moore | |
| 2011/0230116 | A1 | 9/2011 | Balik | |
| 2011/0248835 | A1 | 10/2011 | Speegle et al. | |
| 2011/0306299 | A1 | 12/2011 | Wells | |
| 2012/0039483 | A1 | 2/2012 | Burke et al. | |
| 2012/0087128 | A1 * | 4/2012 | Zakula et al. | 362/249.02 |
| 2012/0171942 | A1 * | 7/2012 | Herzer | 454/152 |
| 2013/0084793 | A1 * | 4/2013 | Yang et al. | 454/248 |

FOREIGN PATENT DOCUMENTS

| | | | |
|---|---|---|---|
| JP | 4-49381 | | 2/1992 |
| JP | 05119784 | A * | 5/1993 |
| JP | 5-230853 | | 9/1993 |
| JP | 2001157642 | A * | 6/2001 |
| JP | 2004301438 | A * | 10/2004 |
| JP | 2008164206 | | 7/2008 |
| JP | 2008190766 | | 8/2008 |

* cited by examiner

AUDIO EQUIPPED FAN

CROSS REFERENCE TO RELATED APPLICATION

The application is a continuation of U.S. patent application Ser. No. 13/962,625, filed Aug. 8, 2013, which claims the benefit of U.S. Provisional Application No. 61/799,140, filed Mar. 15, 2013, and U.S. Provisional Application No. 61/745,560, filed Dec. 22, 2012, which are hereby incorporated herein by reference in their entirety.

FIELD

The invention relates generally to audio systems, and more particularly to audio equipped fans and network enabled fans.

BACKGROUND

Numerous types of speaker systems are available for providing music and other audio content in homes, businesses and other settings. Known speaker systems that are well-suited for use in certain areas can be unsuitable for use in other areas due to a wide variety of factors such as, for example, space limitations, lack of convenient access to a source of electrical power, potential exposure to high humidity, difficulties associated with mounting the speakers, or esthetic issues with power cords and/or connecting cords that transmit audio signals to the speakers. Use of battery-powered speakers can eliminate the need for power cords, but can be inconvenient due to the fact that batteries require periodic replacement or recharging, and due to the fact that speaker systems will cease to function unexpectedly if batteries become discharged. In-wall mounting of speakers can also address some of the concerns relating to space limitations and esthetics, but the expense of in-wall mounting can be significant, particularly if wiring is to be run through the walls to power the speakers and/or provide audio signals. Also, mounting of speakers in a wall that is shared by two rooms with the intention of providing music or other audio content in one room only can sometimes undesirably lead to propagation of sound to adjoining rooms beyond acceptable levels.

Use of Bluetooth technology and other wireless technology can of course eliminate the need for wired connections to transmit audio signals, but the audio quality may suffer in areas where electronic interference may be present. From the standpoint of the listener, audio quality can also be affected significantly by factors such as speaker placement, obstacles or lack of obstacles between the listener and the speaker, acoustics of the room in which the speakers are placed, background noise, and speaker volume or loudness.

One of the more difficult challenges in providing high-quality audio in homes, businesses and other settings relates to provision of music and other audio content in bathrooms, where factors such as acoustics, fan noise, shower noise, moisture and humidity can be particularly problematic. There is a need for improvements in sound systems that can address the problems associated with these factors, and in methods of manufacturing and installing such systems.

Figure 1A:
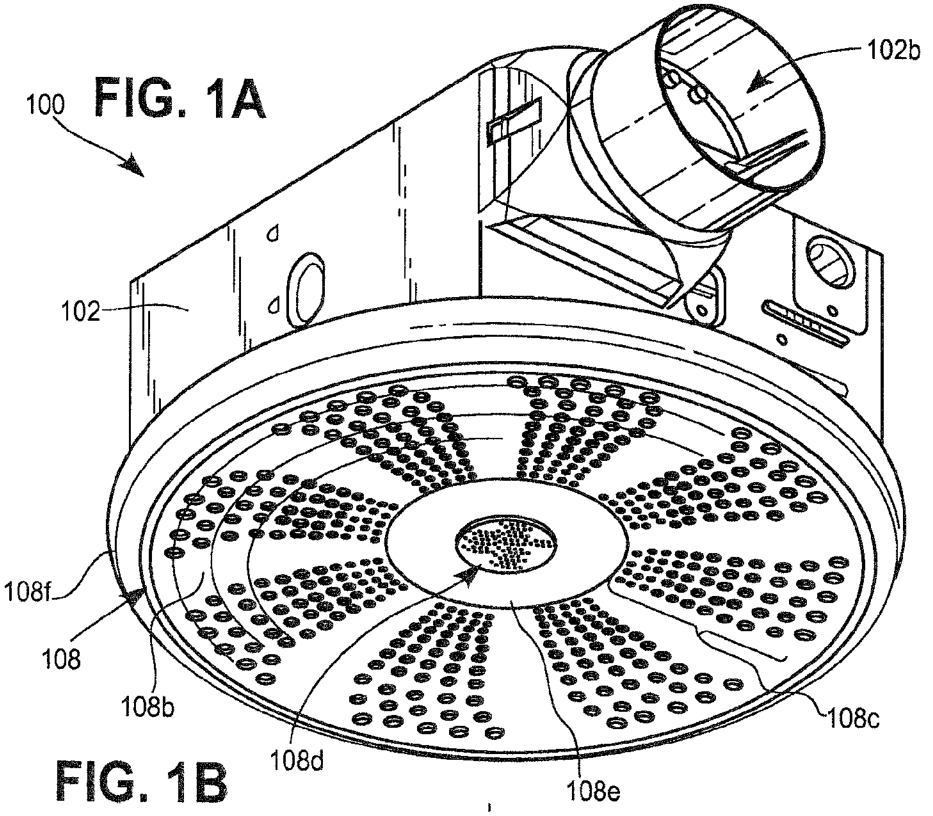
FIGS. 1A-D are perspective, bottom, side and rear views, respectively, of an exemplary fan embodiment, with FIG. 1C being partially in section so that internal components are visible.

Corresponding reference characters indicate corresponding components throughout the several views of the drawings. Elements in the figures are illustrated for simplicity and clarity and have not necessarily been drawn to scale. For example, the dimensions of some of the elements in the figures may be exaggerated relative to other elements to help to improve understanding of various embodiments. Also, common but well-understood elements that are useful or necessary in a commercially feasible embodiment are often not depicted in order to facilitate a less obstructed view of the illustrated elements.

DETAILED DESCRIPTION

The following description is not to be taken in a limiting sense, but is made merely for the purpose of describing exemplary embodiments. Reference throughout this specification to "one embodiment", "an embodiment", "some embodiments", "one form", or similar language means that a particular feature, structure, or characteristic described in connection with the embodiment is included in at least one embodiment of the present invention. Thus, appearances of the phrases "in one embodiment," "in an embodiment," "some embodiments", "in one form", "in another form", and similar language throughout this specification may refer to the same embodiment and/or may refer to separate or alternate embodiments as well. Furthermore, the described features, structures, or characteristics of the invention may be combined in any suitable manner in one or more embodiments.

FIGS. 1A-D illustrate an audio equipped fan assembly 100 which includes a housing 102 having an opening at its bottom to define an air inlet 102*a*. The housing may be made of metal, such as aluminum, and has a generally rectangular body with a circular outlet duct member 102*b* sized to connect with conventional ductwork.

Motor 104 is disposed at least partially within the housing 102 and is positioned in a vertical orientation with the motor output shaft 104*a* extending vertically down toward the housing inlet 102*a* and aligned along a central axis of the inlet opening 102*a*. In the form illustrated, the motor 104 is only partially disposed within housing 102 and, more particularly, only a lower portion of the motor including the motor output shaft 102*a* is within the housing 102 while the remainder of the motor 104 is within a housing cap member 102*d*. In alternate embodiments the motor 104 could alternatively be mounted entirely within the housing 102 if desired.

A centrifugal impeller 106 is connected directly to the output shaft 104*a* of motor 104 and is rotated by the output shaft 104*a* to pull air into the inlet 102*a*, through the housing interior 102*c* and out of the exhaust fan 100 via outlet 102*b*. The centrifugal fan 106 will pump a constant volume of air (constant CFM) through the fan housing at a constant fan speed and allows for quite operation (e.g., 2.0 Sones or less). In other embodiments different types of fans, such as axial-flow fans, scroll fans, or cross-flow fans may be used. Impellers and other components could be positioned or located outside of the housing 102.

A grille 108 is connected to the bottom of the housing and positioned in axial alignment with the impeller. The grille has an interior side 108*a* and an exterior side 108*b*, and defines a first array of openings 108*c* through which air may flow upward while the fan is operated and a second array of openings 108*d* through which sound may propagate downward. In the form illustrated, the openings 108*c*, 108*d* are in a swirl pattern, with the first openings decreasing in size or diameter toward the center of grille 108. The openings 108*d* in the second array are smaller in size or diameter than the smallest openings of the first array 108*c*. The smaller size of second openings 108*d* may help to prevent moisture from reaching the speaker 110 as air flow will find less resistance in passing through the larger openings of the first array of openings 108*c*.

In alternate forms, it should be understood that the first and second openings 108*c*, 108*d* may be provided in similar shapes and sizes. In the form illustrated in FIGS. 1A-D, a border, such as a solid, unperforated annular region 108*e* is provided between the first and second openings 108*c*, 108*d*. In other forms, a particular pattern can make a seamless transition from the first openings 108*c* to the second openings 108*d*.

Figure 1B:
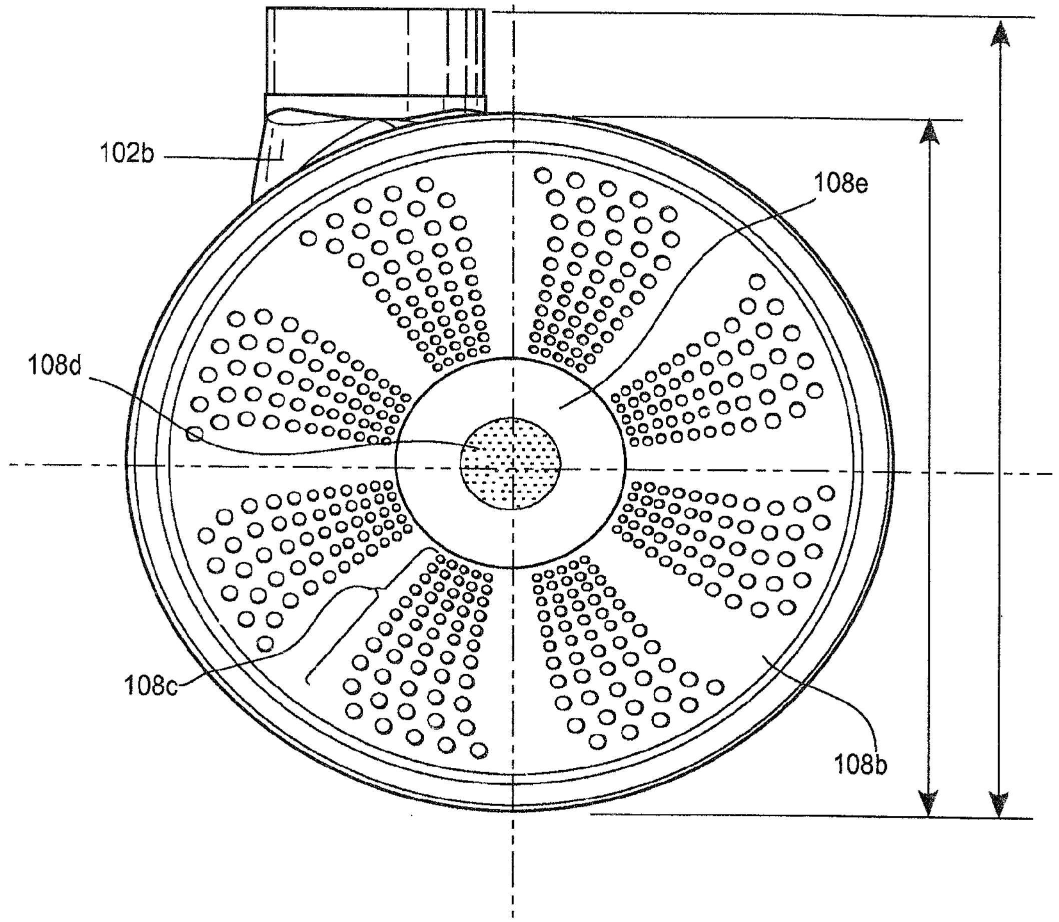
Figure 1C:
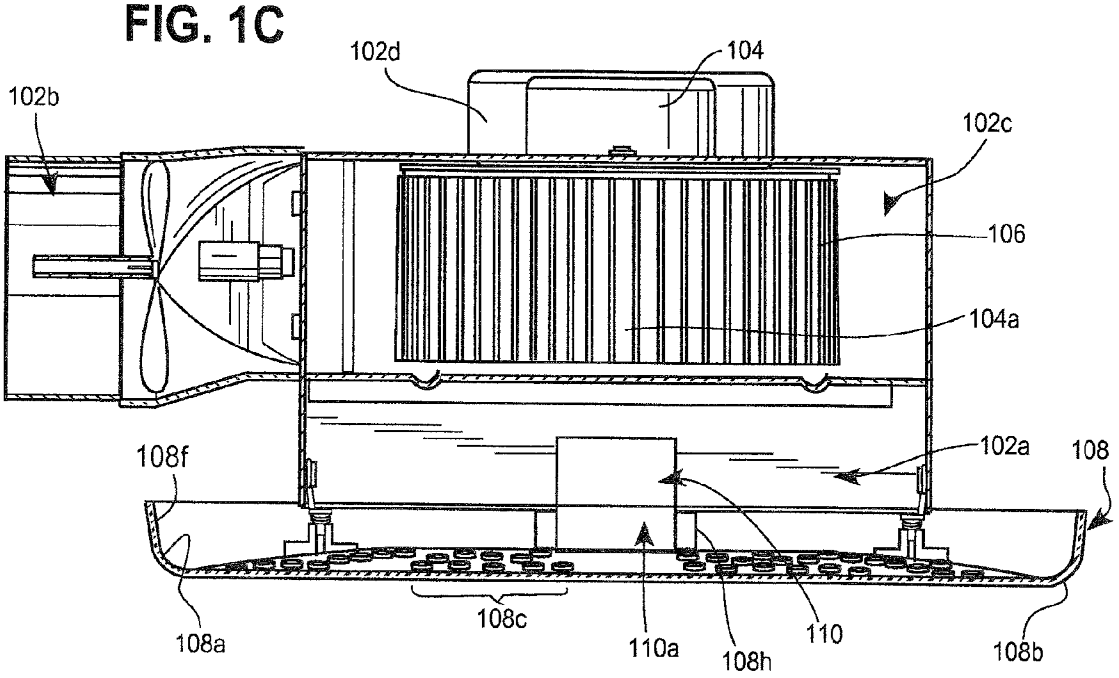
Figure 1D:
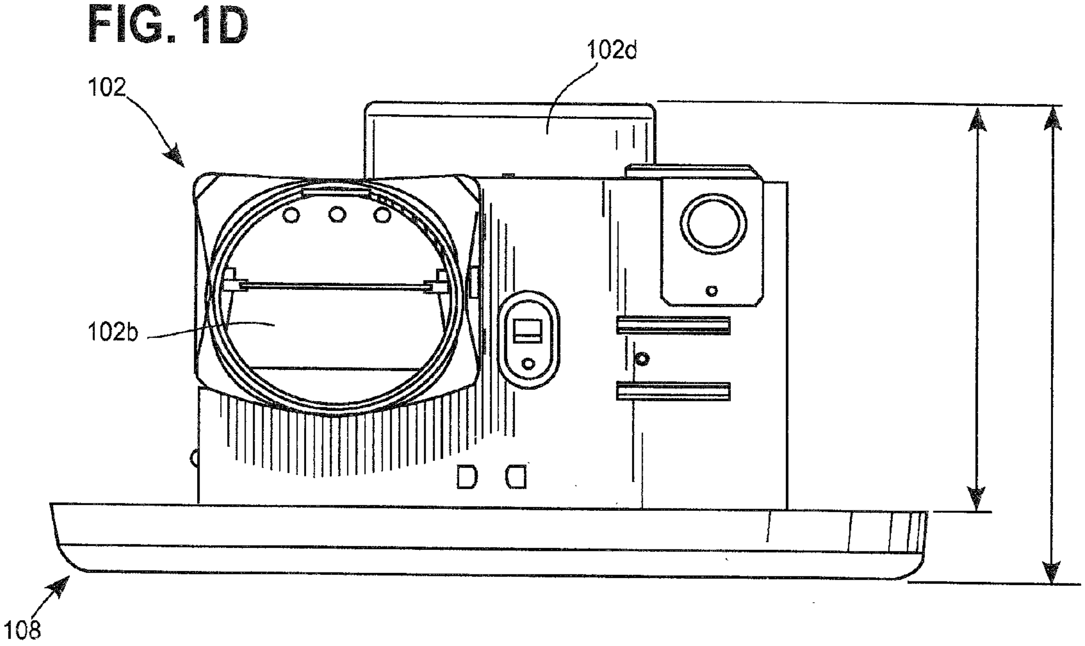

As is best illustrated in FIG. 1C, the grille 108 has a shallow dish shape with an upstanding outer annular wall 108*f* located at its perimeter and a slightly concave lower surface in which openings 108*c* are disposed. The annular wall 108*f* is angled upward and outward and is rounded to assist with molding and includes guides which are used to center and align the grille 108 during installation across housing inlet 102*a*. In a preferred form, and as best illustrated in FIG. 1B, the grille 108 has an outer diameter that is sufficient to cover housing 102 with the exception of a small portion of the round outlet duct 102*c*. This allows the housing 102 to be hidden easily in a ceiling and allows only the more decorative grille 108 to remain visible once the fan 100 is installed.

In the form illustrated, speaker 110 is connected to the grille 108 and positioned along a central axis of the grille so that air may flow around the speaker 110 and through the fan 106 and fan housing 102 without interruption. This also allows sound to downwardly propagate from the speaker 110 located on the interior side 108*a* of the grille 108, through the second openings 108*d* to the exterior side 108*b* of the grille 108 and into the room above which the fan 100 is installed. More particularly, in the form illustrated, the grille 108 includes a mount 108*h* for mounting the speaker in alignment with the second array of openings 108(*d*). The mount 108*h* preferably includes a first mating structure that mates with a second mating structure found on the speaker 110. In this form, the mating structures are the outer annular wall of the speaker 110 and the annular wall of the grille mount 108*h* which mate with one another via a friction fitting.

To help reduce fan noise and thereby enhance the audio quality associated with the system, the speaker is positioned directly beneath the fan motor and the axis of the impeller, and thus blocks some of the noise associated with the fan. This placement also has the benefit of minimizing or at least reducing distance between the speaker and the listener. In addition, the number and size of openings 108*c* and the material and configuration of the grille are preferably selected so that the grille reduces fan noise significantly, particularly in upper frequency ranges, without unduly restricting airflow. To this end, the grille 108 is preferably made of a nonmetallic material having sound-damping properties, and the diameter of the grille 108 is preferably greater than the diameter of the impeller 106. The grille diameter provides an outer region of the grille 108 that permits airflow into the fan through openings that are farther from the source of fan noise, thus helping to attenuate fan noise in the room and enhance audio quality.

In the form illustrated, speaker 110 has a generally circular-cylindrical side wall 110*a* and the grille mount 108*h* includes an annular wall 108*a* extending up from the interior side 108*a* of the grille 108 that is sized to receive the round housing portion 110*a* of speaker 110. More particularly, in the form illustrated, the round housing portion 110*a* of speaker 110 has a first diameter and the annular wall of the grille mount 110*h* defines an opening with a second diameter with the second diameter being slightly larger than the first diameter so that at least a portion of the round housing portion 110*a* of the speaker 110 may be disposed in the annular wall of the grille when the speaker 110 is connected to the grille 108. In this way, the annular wall 108*h* of grille 108 forms a sleeve within which a portion of the rounded speaker housing portion 110*a* is disposed. The speaker 110 may be fastened to the mount 108*h* if desired, such as by a screw, bolt, rivet, adhesive, or other means, or may simply be held in place by friction and/or gravity.

Although the embodiment illustrated shows the sleeve 108*h* receiving less than a quarter of the speaker 110, it should be understood that in alternate embodiments the sleeve 108*h* may receive more or less of the speaker 110 simply by adjusting the height of the mount wall 108*h*. Similarly, it should be understood that in alternate forms, the speaker 110 make take on different shapes and sizes. So too may the mount 108*h* take on different shapes and sizes so that a mating relationship may be made between the mount 108*h* and the speaker 110. For example, in some forms, the mating relationship between the speaker and the mount 108*h* may be designed as a friction fit or snap fit so that the speaker 110 snaps into the grille mount 108*h* to secure the speaker 110 to the grille 108. For example, as will be discussed further below, the speaker 110 and mount 108*h* may be designed with a combination of hooks and mating recesses or depressions which allow the speaker 110 to be securely attached to or fastened to the grille 108.

Turning back to FIGS. 1A-D, in this form, the speaker 110 has a round housing portion with a first outer diameter and the second openings 108*d* of the grille 108 are positioned about a central axis of the grille 108 in a circular pattern having a second diameter that is generally or approximately equal in size to the first diameter so that the speaker openings 108*d* match the footprint of the speaker 110. In an alternate form, however, the second diameter that defines the bounds of the second openings 108*d* may be made larger than the first diameter of speaker 110 so that the footprint of the speaker 110 is smaller in size than the spread or bounds of the second speaker openings 108*d*.

Although the speaker 110 has been discussed thus far as being connected to the grille 108, it should be understood that in alternate forms the speaker 110 may be connected to at least one of the housing 102, motor 104, fan 106 and grille 108. Preferably such connections will align the speaker 110 on the interior side 108*a* of the grille 108 with the second openings 108*d* of the grille so that sound may travel from the speaker 110 through the grille 108. In these alternate embodiments, as with the embodiment of FIGS. 1A-D, the first and second openings 108*c*, 108*d* may maintain similar shapes or patterns over the grille 108. For example, the first openings 108*c* may decrease in size from an outer perimeter or circumference of the grille 108 to a center or central axis of the grille 108 and the second openings 108*d* may maintain this pattern by either being smaller in size than any of the first openings 108*c* or by decreasing in size themselves from an outer perimeter or circumference of the second array of openings 108*d* to the center or central axis of the grille 108. Alternatively, as mentioned above, the first and second openings 108*c*, 108*d* may have distinct shapes or patterns so that the first and second openings 108*c*, 108*d* can easily be distinguished from one another. The grille 108 may further define a border region 108*d* between the first and second openings to distinguish the first and second openings 108*c*, 108*d* from one another.

Turning back to FIGS. 1A-D, the speaker 110 and motor 104 share a common power source. In this form, the power source is an AC power supply such as a 110-240V, 50-60 Hz power supply. In a preferred form, the speaker will be wired so that it remains constantly powered or constantly on so that the speaker can be used to transmit sound regardless of whether power is being supplied to the fan or regardless of whether the fan is being operated or turned on. Thus, in this embodiment the speaker 110 is hard-wired into the fan assembly 100.

In alternate forms, the speaker 110 and motor 104 may be powered via separate or different power sources. For example, in one form the speaker 110 is battery operated and the motor 104 is powered via an AC power source. In such an embodiment a dry cell battery may be used to power the Bluetooth speaker. In order to conserve battery life, the speaker 110 may be set up to switch on with the motor, but may shut off within a predetermined amount of time should no operating signal or pairing be made between the Bluetooth speaker and an electronic device, such as a mobile or hand held device, e.g., a phone, MP3 player or other music player, laptop, tablet or other computer, etc. In a preferred form, the predetermined time will be any one of one, two, five, ten, fifteen or twenty minutes depending on the application or place and type of fan and/or battery used. Preferably the speaker will be of the mini Bluetooth type having an signal to noise ratio (SNR) greater or equal to 75 DB, and an IP44 rating to withstand the humidity that the speaker 110 may be exposed to if installed in a bathroom with shower or tub.

In the form illustrated in FIGS. 1A-D, the audio equipped fan assembly is network enabled or capable of being connecting into a network with one or more electronic devices. For example, when used with a Bluetooth speaker, the speaker can be paired with multiple electronic devices to form a local area network (LAN). For example, a smart phone equipped with a Bluetooth transmitter may be used to play music over the speaker 110 of the fan assembly 100. The speaker fan assembly may itself be equipped with a Bluetooth transceiver and microphone (mic) and therefore allow two-way communications to take place between the speaker 110 and the electronic device. Thus, a user may not only be able to play music over the speaker 110 from a remote electronic device, but may also be able to conduct a telephone call or other telecommunications via the fan assembly 100. The electronic device could be a telephone, a tablet or netbook computer, or it may be a component that is part of a home or business communication system such as an intercom system. In other embodiments, the fan assembly 100 may be configured to handle only one-way communications. Similarly, although Bluetooth is discussed in the above examples, it should be understood that the assembly may be set up using other industry standards for radio or infrared communication.

Turning back to the embodiment of FIGS. 1A-D, the audio equipped fan assembly may further include a remotely controllable actuator or actuator spaced apart from the assembly 100 for turning on and off the fan or speaker. The actuator could simply be a single actuator used to turn on and off both the fan 106 and speaker 110 at the same time. In another form, the actuator could include a first actuator for turning on and off the fan and a second actuator, separate from the first actuator, for turning on and off the speaker so that the fan and speaker may be operated independent of one another. In yet another form, the assembly 100 may include a controller connected to the actuator for detecting power line communication (PLC) via toggling of the actuator on and off. Toggling of the actuator on and off a first number of times may instruct the controller to turn on both the fan and the speaker. Toggling the actuator on and off a second number of times may instruct the controller to turn on the speaker only and not the fan. PLC actuation is discussed in expired U.S. Pat. No. 4,716,409 issued to Hart et al. on Dec. 29, 1987, expired U.S. Pat. No. 4,322,632 issued to Hart et al. on Mar. 30, 1982 and in published U.S. Patent Application No. 2011/0148508 A1, published to Liu et al. on Jun. 23, 2011, the disclosures of which are incorporated herein by reference. In still other forms and as will be discussed below, these actuators may operate manually or automatically. For example, a motion detector actuator may be used to detect a person's presence and automatically activate the speaker 110 (at least for some time) while the person is present. If no signal or pairing is made with the speaker in a predetermined amount of time, it may again turn off. Then after a predetermined amount of time has passed, the speaker may automatically turn back on once a person's presence is detected.

As mentioned above, the assembly 100 preferably will seal the speaker to minimize, reduce or prevent exposure of the speaker to moisture. More particularly, the speaker, transceiver and/or microphone may also be sealed to prevent or reduce exposure to moisture. In one form, the seal comprises a cover made of a water-impermeable, moisture-resistant or mesh or screen material over the speaker that is permeable to sound but impermeable or less permeable to moisture. In addition, a seal such as an O-ring may be used to seal the speaker to a portion of the fan assembly.

In the form illustrated in FIGS. 1A-D, the audio equipped fan assembly 100 is configured such that the speaker 110 is positioned below the motor 104 and fan 106 and arranged to propagate sound waves downward and avoid excessive transmission of sound waves upward. This helps reduce noise that the assembly 100 might otherwise make. For example, in applications where the fan 100 is mounted in the ceiling of a room, it is likely desirable to prevent the music or other audio coming from speaker 110 from travelling up or out to the sides to other rooms in the building structure. In the form illustrated, the grille 108, speaker 110, motor 104 and fan 106 are aligned along a common central axis with the speaker 110 located below the motor 104 and fan 106 so that the insulation used to contain or dampen noise generated from these devices can also be used to help contain or dampen unwanted noise generated by speaker 110.

In the form illustrated in FIGS. 1A-D, the grille 108 includes a first region above second openings 108*d* that permits downward propagation of sound waves while restricting admission of moisture into the speaker 110 or a speaker interior space, and a second region above first openings 108*c* that permits admission of moisture into and through the inner cavity 102*c* of the fan housing 102 or fan interior space while decreasing fan noise beneath the fan assembly 100. In a preferred form, at least one of the fan 106, motor 104 and speaker 110 or electrical wiring connecting these components to a power source is shielded to avoid the fan 106 and motor 104 from interfering with the speaker 110 and the transmission of sound from the speaker 110. For example, in one form the motor 104 and wiring connecting the motor to a power source are electrically isolated from the speaker 110 and speaker wiring to avoid motor interference with the speaker or noise on the power line from interfering with the performance of speaker 110. In another form, the motor 104 and wiring connecting the motor to a power source is shielded from the transceiver associated with the speaker 110 to prevent the motor 104 from interfering with signals transmitted to and/or from the transceiver and/or audio produced by the speaker 110 and/or audio received by the microphone.

In ceiling mounted applications like those discussed above, audio equipped fan 100 may also include insulation positioned within the housing to prevent or dampen upward or sideways propagation of sound waves from the fan assembly such as the noise discussed above. This insulation may consist of the fan housing 102 itself, or it may include additional items such as insulation of any type (e.g., foam insulation, etc.) which is used to line inner or outer surfaces of the housing 102 or inner or outer surfaces of the other components of the fan assembly (e.g., motor 104, fan 106, etc.). Additional insulation may be packed around the fan assembly 100 to further reduce the risk of unwanted noise propagating out of the intended area (e.g., noise propagating to neighboring rooms, etc.).

Although the embodiments illustrated herein disclose a fan only fan assembly, it should be understood that in alternate forms the fan assembly may include other conventional features such as a light and/or a heat lamp. For example, the fan assembly 100 may alternatively include a light connected to the audio equipped fan assembly on the interior side 108*a* of grille 108 wherein the grille further includes a light-transmissive member to illuminate an area on the exterior side 108*b* of grille 108, and having an actuator for turning on and off one or more of the fan, speaker and light. In preferred forms, a fan assembly 100 will be provided in 50CFM, 60CFM, 70CFM, 80CFM, 90CFM, 100CFM, 110CFM, 120CFM, 130CFM, 140CFM and 150CFM models with and without lights, ranging in noise level between 0.75-2.0 Sones, and use a Bluetooth speaker operating on a frequency between 160 Hz-20 KHz with a SNR greater than 90 DB.

Figure 2A:
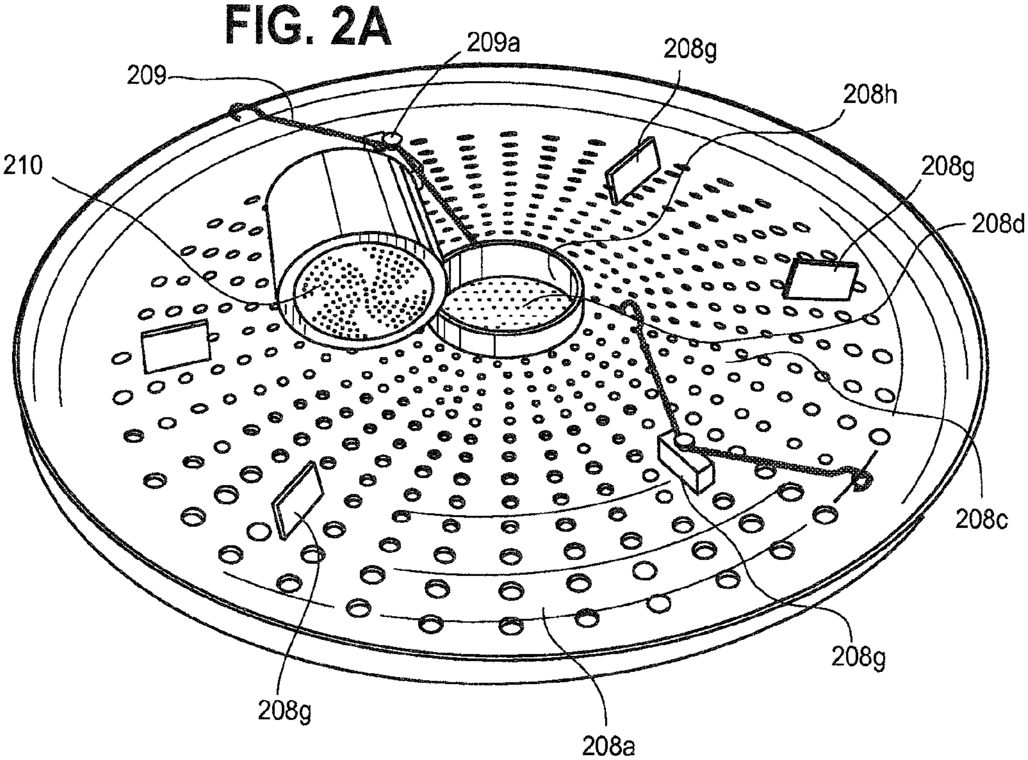
FIGS. 2A-C are perspective views of a second embodiment.
Figure 2B:
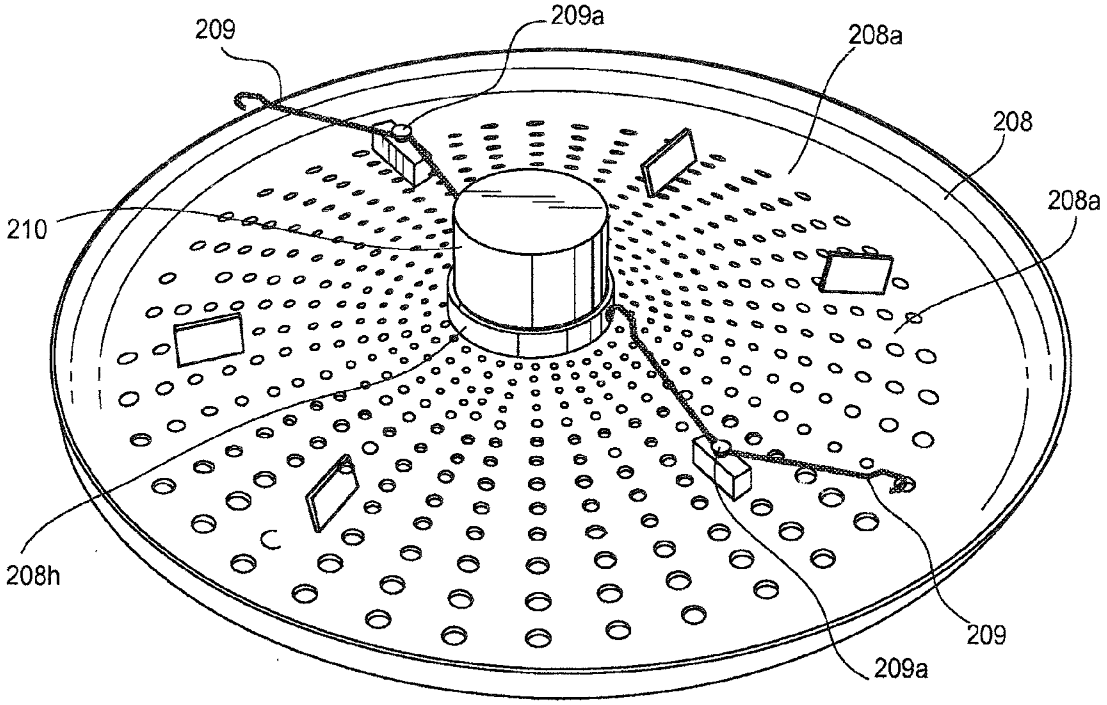
Figure 2C:
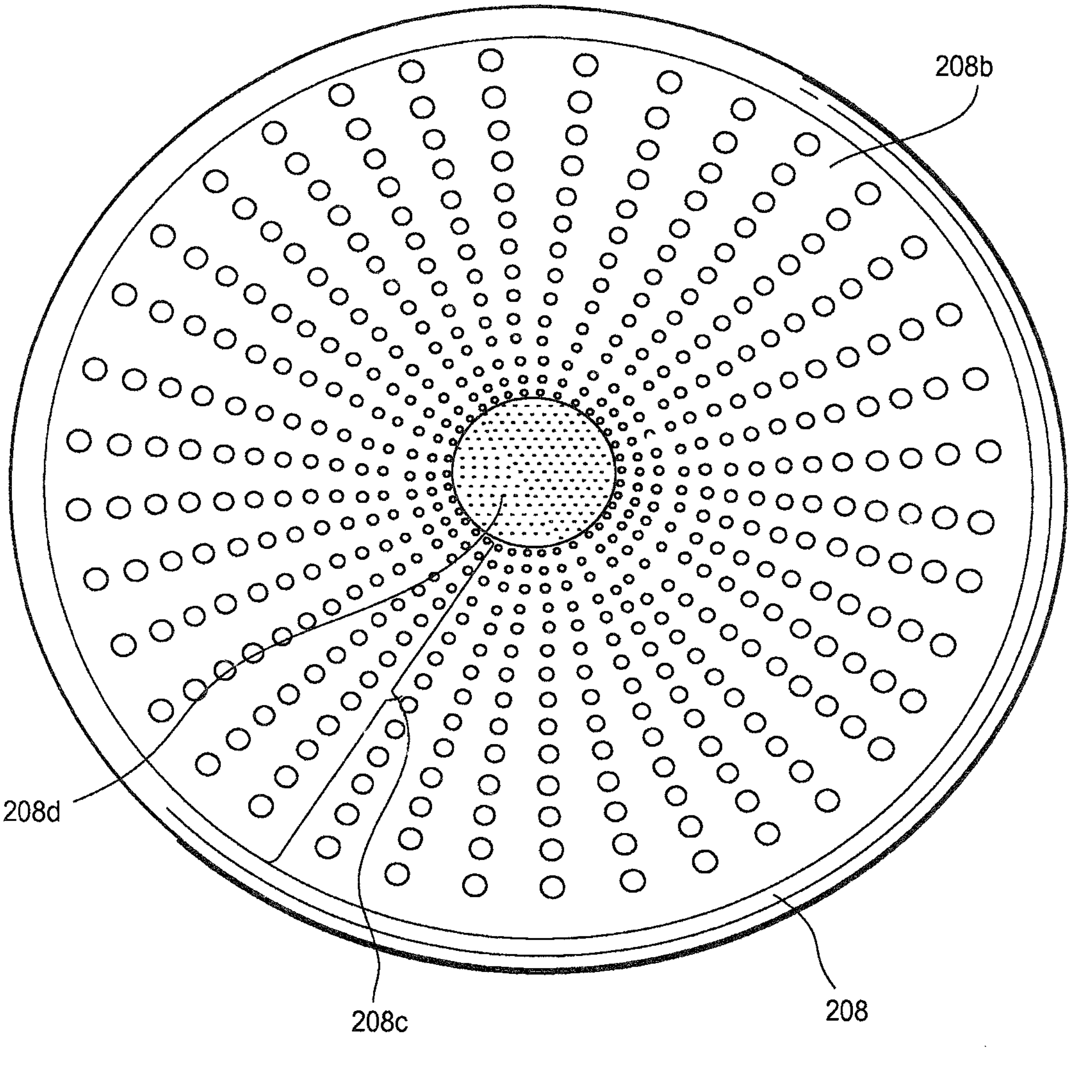
Figure 3A:
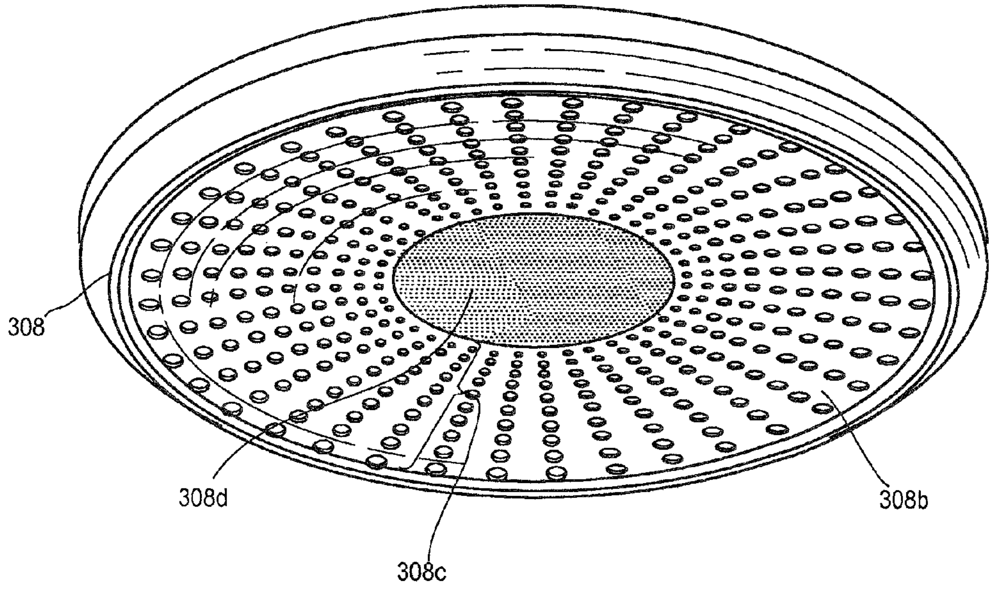
FIGS. 3A-D illustrate a third embodiment without illustration of the speaker.
Figure 3B:
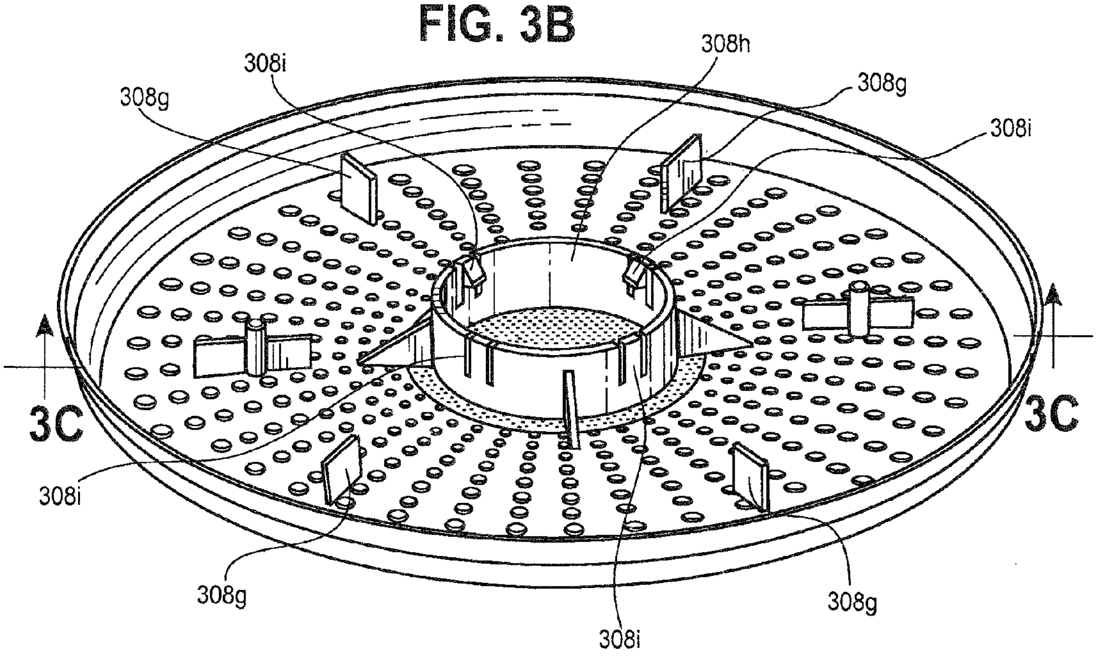
Figure 3C:
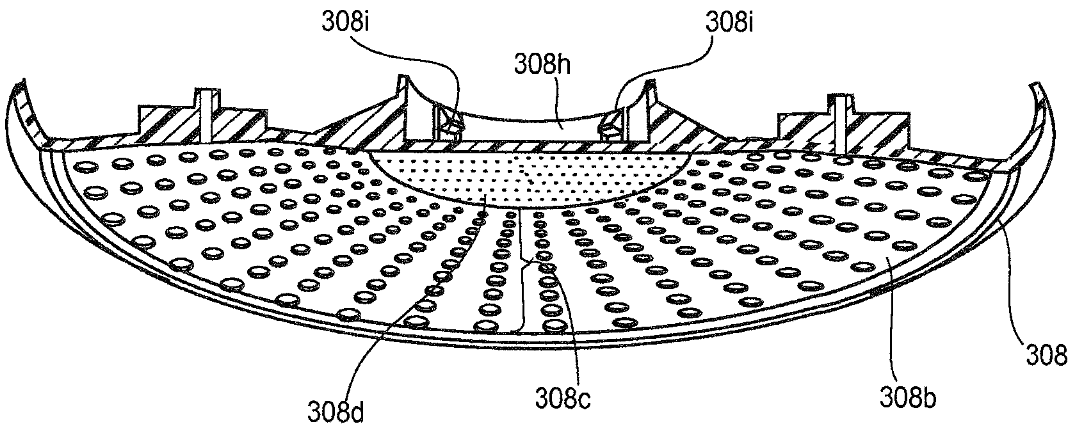
Figure 3D:
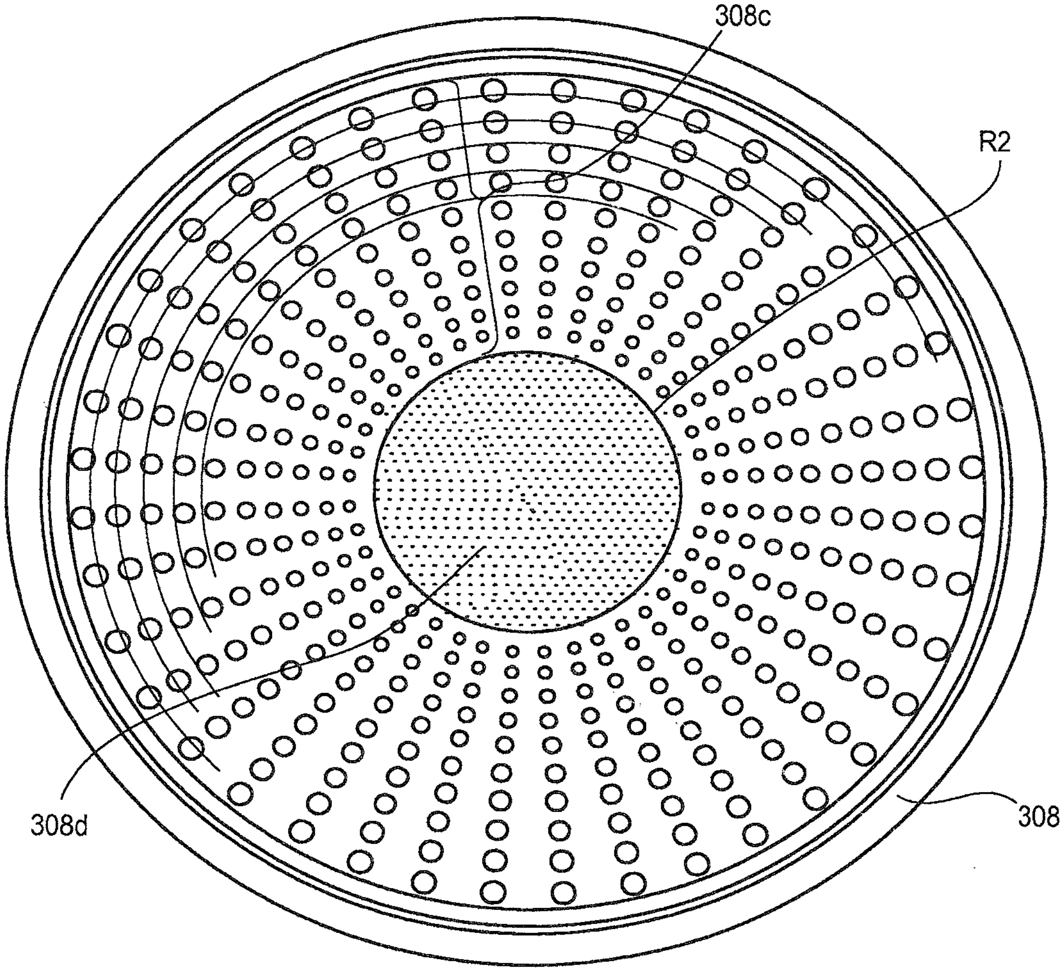

FIGS. 2A-C illustrate another exemplary embodiment of a fan assembly according to the invention. For purposes of convenience, items that are similar to those discussed above with respect to FIGS. 1A-D, will be referenced using the same last two-digit number but using the prefix "2" simply to distinguish one embodiment form another. Thus, in FIGS. 2A-C, the fan assembly is referred to generally by reference numeral 200. In FIG. 2A, a mini Bluetooth speaker 210 is illustrated exploded from the mount 208*h* of grille 208. In this figure, the guide structures 208*g* that help align and/or center grille 208 on the fan assembly housing are also clearly shown. In this form, the guide structures 208 comprise projections or tabs that extend up from the interior surface 208*a* of grille 208. The projections 208*g* preferably are spaced apart to fit just within the opening 202*a* of the air inlet of the housing. In addition, the embodiment of FIGS. 2A-C also illustrates one form of fastener that may be used to connect the grille 208 to the fan housing. The fastener shown is a spring 209 that has first and second distal ends that can be squeezed together to engage or clip into mating receivers or sockets on the side walls of the housing (see, e.g., FIG. 1C). As the grille 208 is pressed up toward the housing the springs 209 expand or the first and second ends separate to pull the grille up tight into engagement with the bottom surface of the housing or the ceiling to which the fan is mounted. To remove, the grille 208 is simply pulled down until the springs 209 can be reached and then the ends of the springs are squeezed together to release the springs from their respective sockets and remove the grille form the housing. In the form illustrated, the springs 209 are connected to the grille 208 via fasteners, such as screws 209*a*.

Yet another grille embodiment is illustrated in FIGS. 3A-D. In keeping with the above this embodiment will use the same last two-digit numbers but with the prefix "3" to distinguish one embodiment with another. In this embodiment, no boarder or blank exists between the first openings 308*c* and second openings 308*d*. In addition, the diameter of the second openings 308*d* is bigger than the diameter of the speaker as can be seen by the fact the second openings 308*d* extend out toward the perimeter or circumference of the grille 208 beyond the annular wall of mount 308*h*. Another difference is that the annular wall of mount 308*h* includes different mating structures for connecting the speaker 210 to grille 208, such as clips 308*i*. In a preferred form, these clips engage mating recesses, such as depressions, in the speaker housing. More particularly, the clips engage shoulders formed by the depressions to securely connect or fasten the speaker to the grille 308.

Figure 4A:
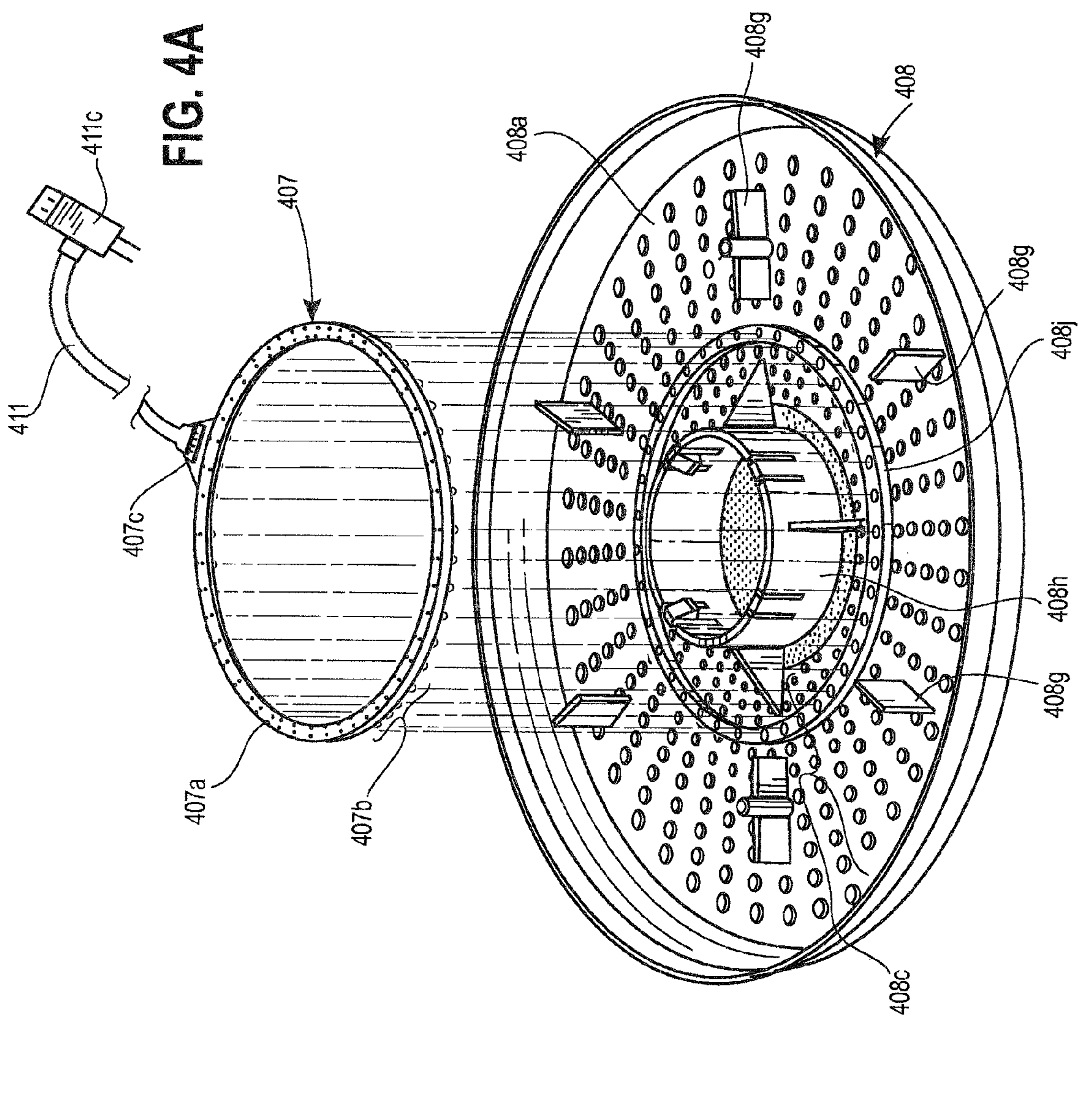
FIGS. 4A-C illustrate a fourth embodiment with FIGS. 4A-B illustrating a light exploded from and connected to the grille and FIG. 4C being partially in section so that internal components are visible.
Figure 4B:
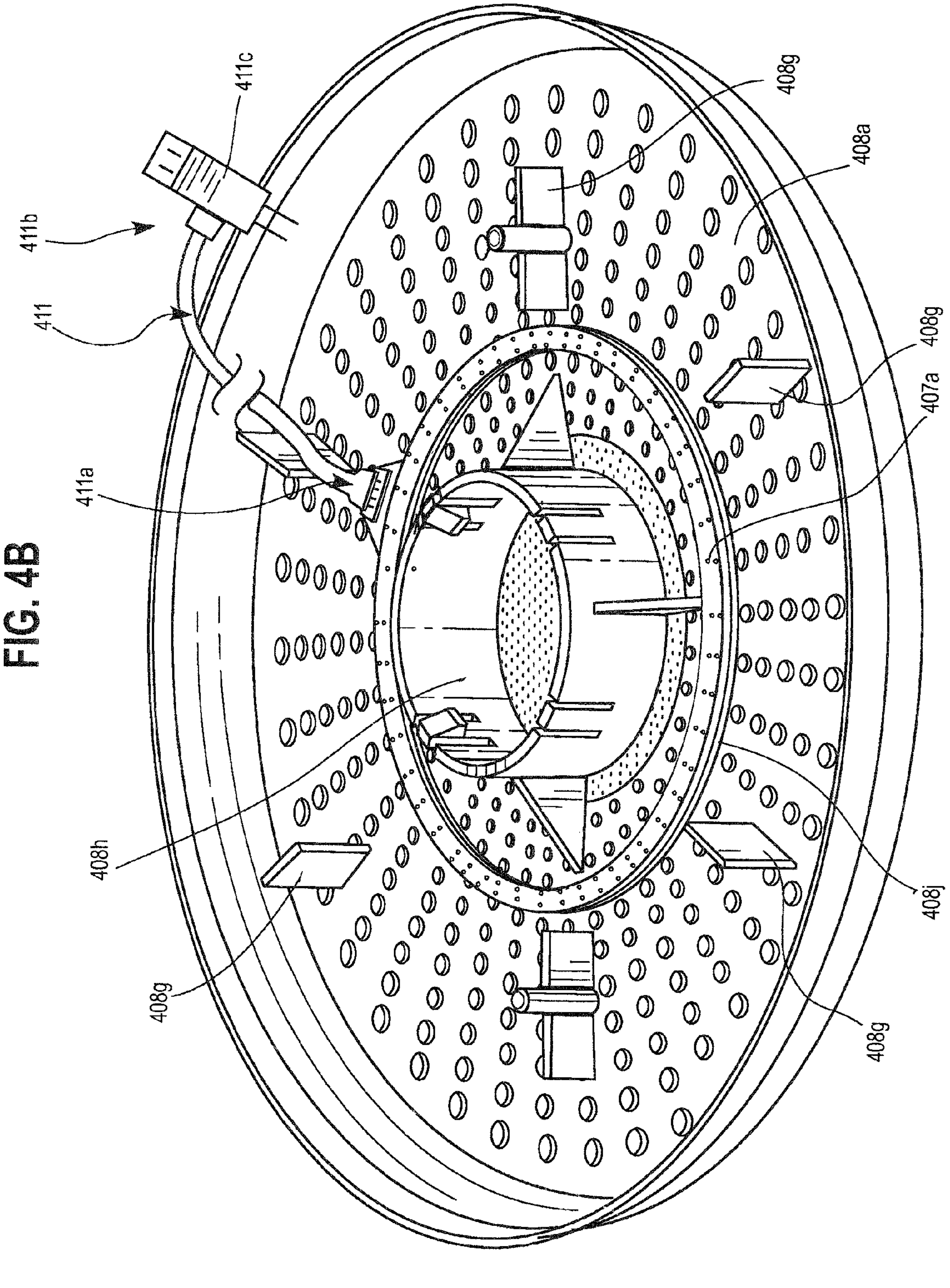
Figure 4C:
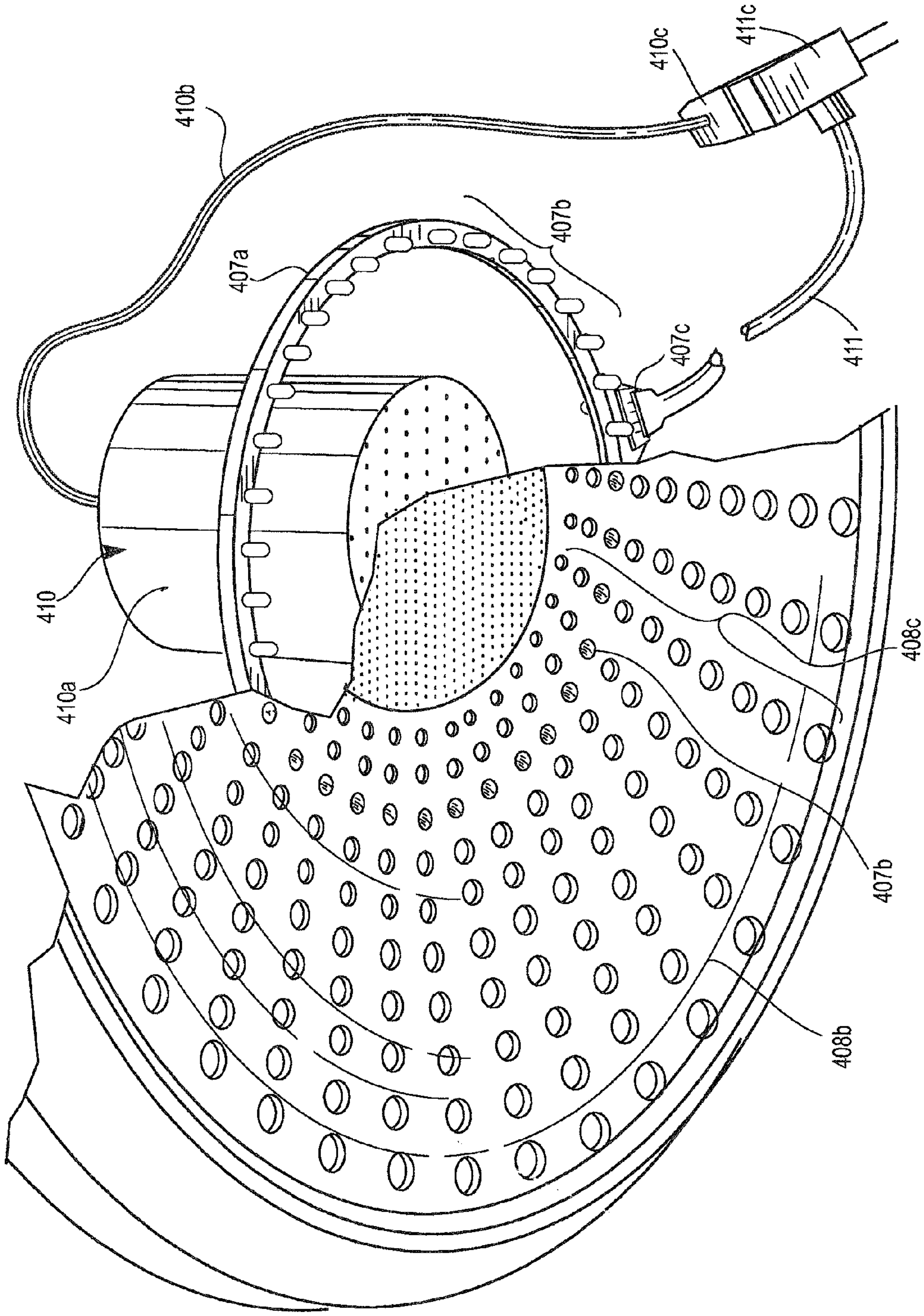

FIGS. 4A-C illustrate a fourth embodiment in accordance with the invention which looks similar to the embodiment of FIGS. 3A-D but with the addition of an optional light for the fan assembly. In keeping with the above this embodiment will use the same last two-digit numbers but with the prefix "4" to distinguish one embodiment with another. In this embodiment, the grille 408 includes a raised wall portion 408*j* that receives at least a portion of optional light assembly 407. In FIG. 4A, light assembly 407 is illustrated exploded from the grille 408 and wall portion 408*j*. Power cord 411 is connected to light assembly 407 and allows the light assembly 407 to be connected to a conventional power outlet which would be located in the fan assembly housing (e.g., two, three or four-pronged power outlets depending on regional power systems where the fan assembly is installed). In a preferred form, light assembly 407 includes a printed circuit board (PCB) 407*a* having a circuit to which are connected a plurality of light emitting diodes (LEDs) 407*b* and a connector or terminal 407*c* to which power cord 411 is connected. The connector 407*c* may take the form of a quick connect/quick disconnect connector that allows the power cord 411 to be readily disconnected from the light assembly 407 so that either the light assembly 407 or power cord 411 can be serviced or replaced if needed. The first end 411*a* of power cord 411 would have a connector halve that mates with the connector halve 407*c* located on PCB 407*a*; whereas, the second end 411*b* would have a plug for connecting into a conventional power outlet.

In the form illustrated, power cord 411 further includes an adapter 411*c* that may include a transformer for converting electrical power from one voltage/current level to another voltage/current level and a rectifier for converting alternating current (AC) to direct current (DC). For example, the adapter 411*c* may be used to convert a 120V AC power source to a 5V (or lower) DC power source to power LEDs 407*b*. Furthermore, in the form illustrated, the power cord 411 is configured as a piggyback power cord which allows a second power cord to be plugged into power cord 411 so that the same power outlet may be used for two components. Thus, with this configuration, the light assembly 407 may be plugged into or connected to a conventional 120V AC power outlet and the connector or plug 410*c* of speaker power cord 410*b* may be plugged into or connected to the piggyback portion of power cord 411 so that the same outlet and adapter is used to power both the fan light 407 and speaker 410. In such an embodiment, the speaker 410 and light assembly 407 would both receive DC power from adapter 411*c* and both would be powered on and off together. One benefit of such a configuration is that an additional power outlet does not have to be added in order to power speaker 410. Thus, fans that are already configured to supply power to a light would not have to be altered in order to add the functionality of a speaker and light.

In the embodiment illustrated, raised wall portion 408*j* defines openings or sockets that LEDs 407*b* are individually aligned with and neatly disposed in when the light assembly 407 and grille 408 are assembled together. This allows light assembly 407 to illuminate portions of the surrounding area on the exterior side 408*b* of grille 408 while still maintaining the desired opening pattern of the first array of openings 408*c* as can best be seen in FIG. 4C. In a preferred form, LEDs 407*b* would be mounted flush with or slightly recessed into the exterior surface 408*b* of grille 408. This may be accomplished by setting the height of the upstanding or raised wall 408*j* so that LEDs 407*b* are so positioned when light assembly 407 is connected to grille 408. The light assembly 407 may also be connected to grille 408 via a fastener or fasteners, such as screws, latches, snap-fittings, etc., if desired.

It should be understood that in alternate embodiments light assembly 407 may take different shapes and sizes including using different types of PCBs, lights (e.g., AC or DC lighting) and power cords 411. Similarly, different types of power outlets and adapters may be used depending on what part of the world the product is being used and/or that regions power grid requirements. In addition, the components of the fan assembly may be placed in different positions.

Figure 5A:
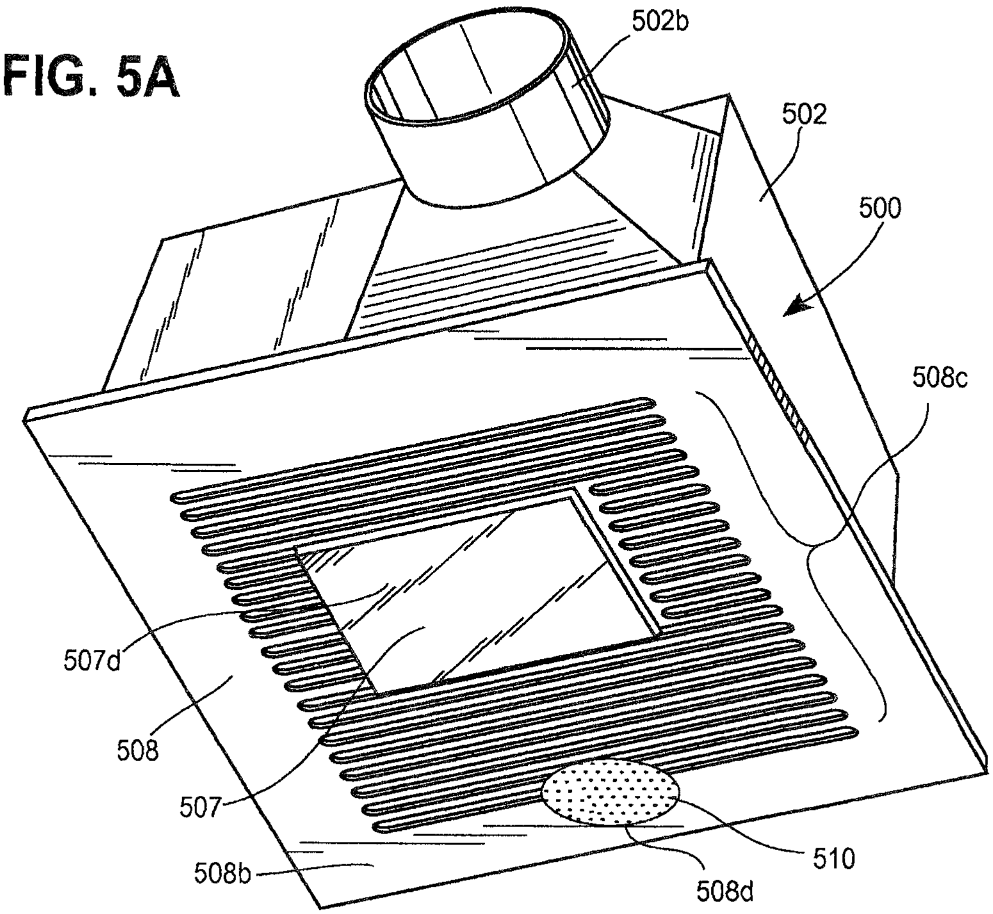
FIGS. 5A-B illustrate perspective and bottom views, respectively, of a fifth embodiment.
Figure 5B:
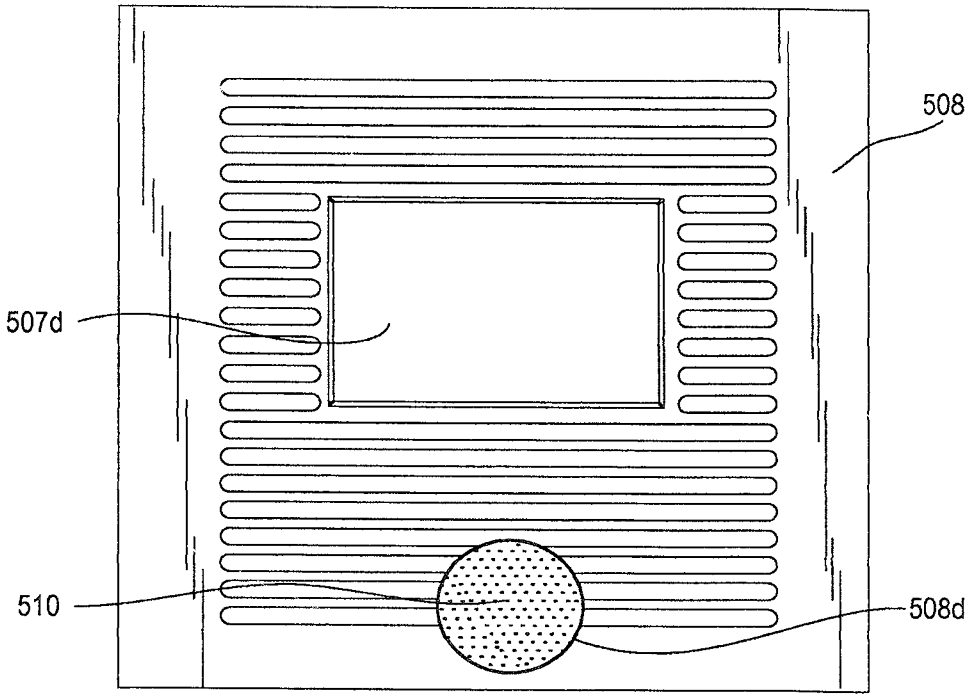

In FIGS. 1A-4C, fan assemblies with round grilles and round speakers are shown and, in the case of FIGS. 4A-C, a round light assembly. However, in alternate embodiments the shapes and sizes of these grilles, speakers and lights may be changed to provide other desired appearances. For example, in FIGS. 5A-B a rectangular grille is illustrated with a rectangular light assembly and a round speaker and in FIGS. 6A-B a rectangular grille, light and speaker are illustrated. In keeping with the above, these embodiment will use the same two-digit reference numerals as prior embodiments but will use the prefixes "5" and "6", respectively, to distinguish one embodiment from another. More particularly, in FIGS. 5A-B, the grille 508 is square, while light assembly 507 is a non-square rectangle and the speaker 510 is round. In this form, the grille 508 defines a first array of openings 508*c* for ventilation and a single second opening 508*d* with which the speaker 510 is aligned. The first array of openings 508*c* take on generally rectangular shapes with rounded ends. However, in alternate embodiments these openings 508*c* may take on any other desired shape (e.g., sharp rectangles, squares, triangles, circles, ovals, etc.) or patterns (e.g., curved patterns, wave patterns, multiple patterns, etc.). In FIGS. 5A-B, the light assembly 507 further includes a translucent cover that is positioned under the actual light source (whether that be LEDs, low voltage lighting, AC light bulbs, etc.). The speaker 510 is also positioned off to one side of the grille 508 near the perimeter thereof instead of being centered. The actual location is at or near the middle of one side of the fan assembly 500 and the light is positioned more in the middle of the grille 508. In a preferred form, the speaker is positioned so that it is generally flush with the exterior surface 508*b* of the grille 508.

Figure 6A:
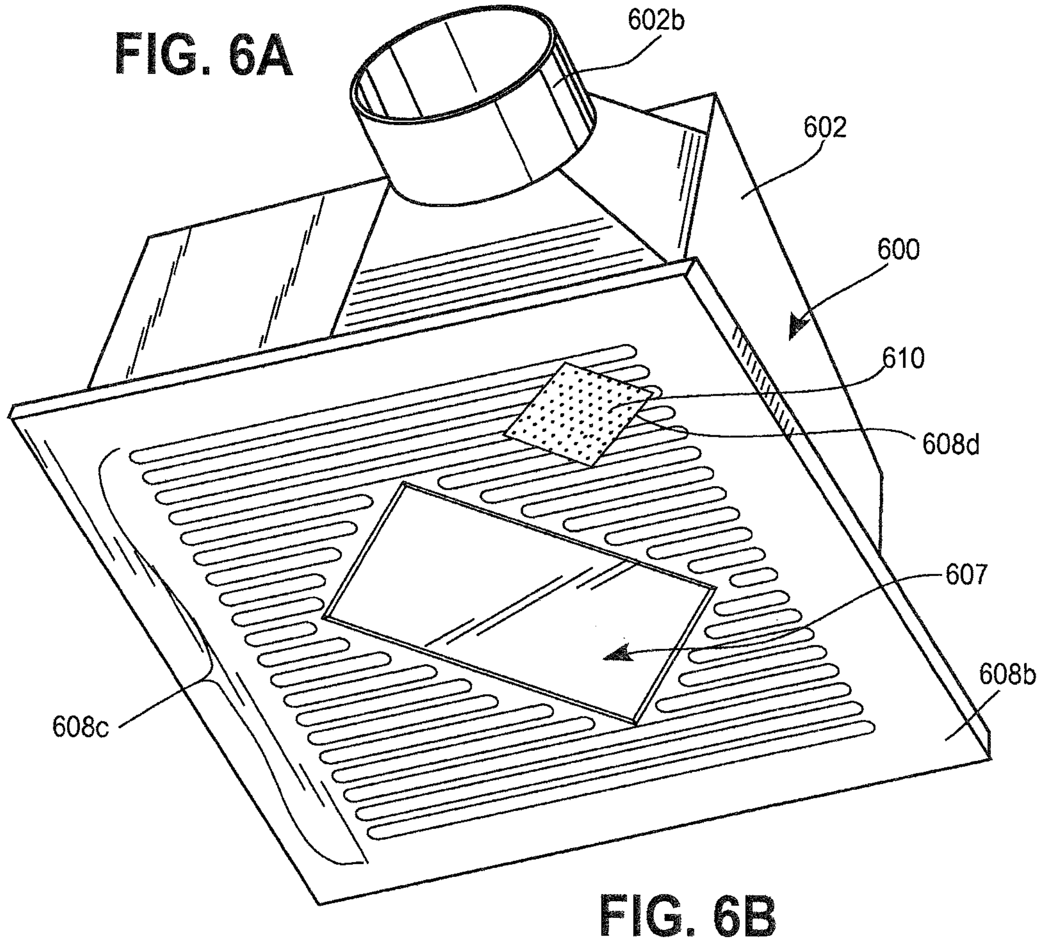
FIGS. 6A-B illustrate perspective and bottom views, respectively, of a sixth embodiment.
Figure 6B:
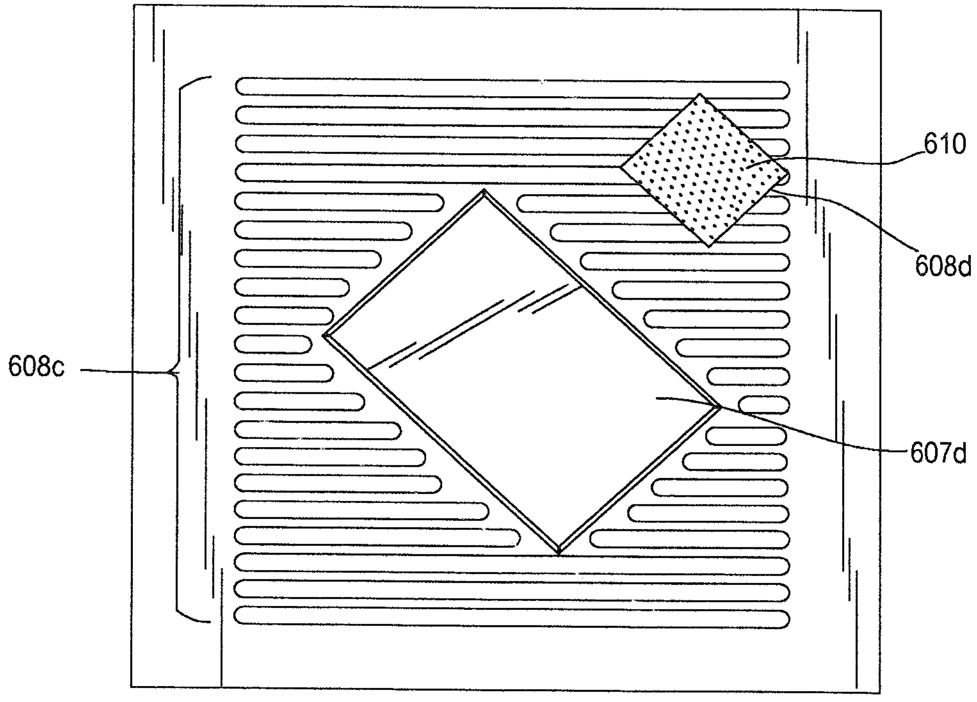

In FIGS. 6A-B, the light assembly 607, grille 608 and speaker 610 are all rectangular in shape. More particularly, in the form illustrated, the grille 608 and speaker 610 are square, the light 607 is rectangular and both the light 607 and speaker 610 are orientated at an angle as compared to the grille 608. Like the embodiment of FIGS. 6A-B, the grille 608 defines a first array of openings 608*c* for ventilation, a single second opening 608*d* with which the speaker 610 is aligned and includes a translucent cover 607*d* positioned under the actual light source. The first array of openings 608*c* take on generally rectangular shapes with rounded ends and the speaker itself is provided with a rectangular body instead of a round body. However, in alternate embodiments these openings 608*c* may take on other shapes or patterns. In FIGS. 6A-B, the light assembly 607 further includes a translucent cover that is positioned under the actual light source (e.g., LEDs, low voltage lighting, AC light bulbs, etc.) and the speaker 610 is positioned in the corner of the grille 608. In a preferred form, the speaker 610 is positioned so that it is generally flush with the exterior surface 608*b* of the grille 608.

Figure 7:
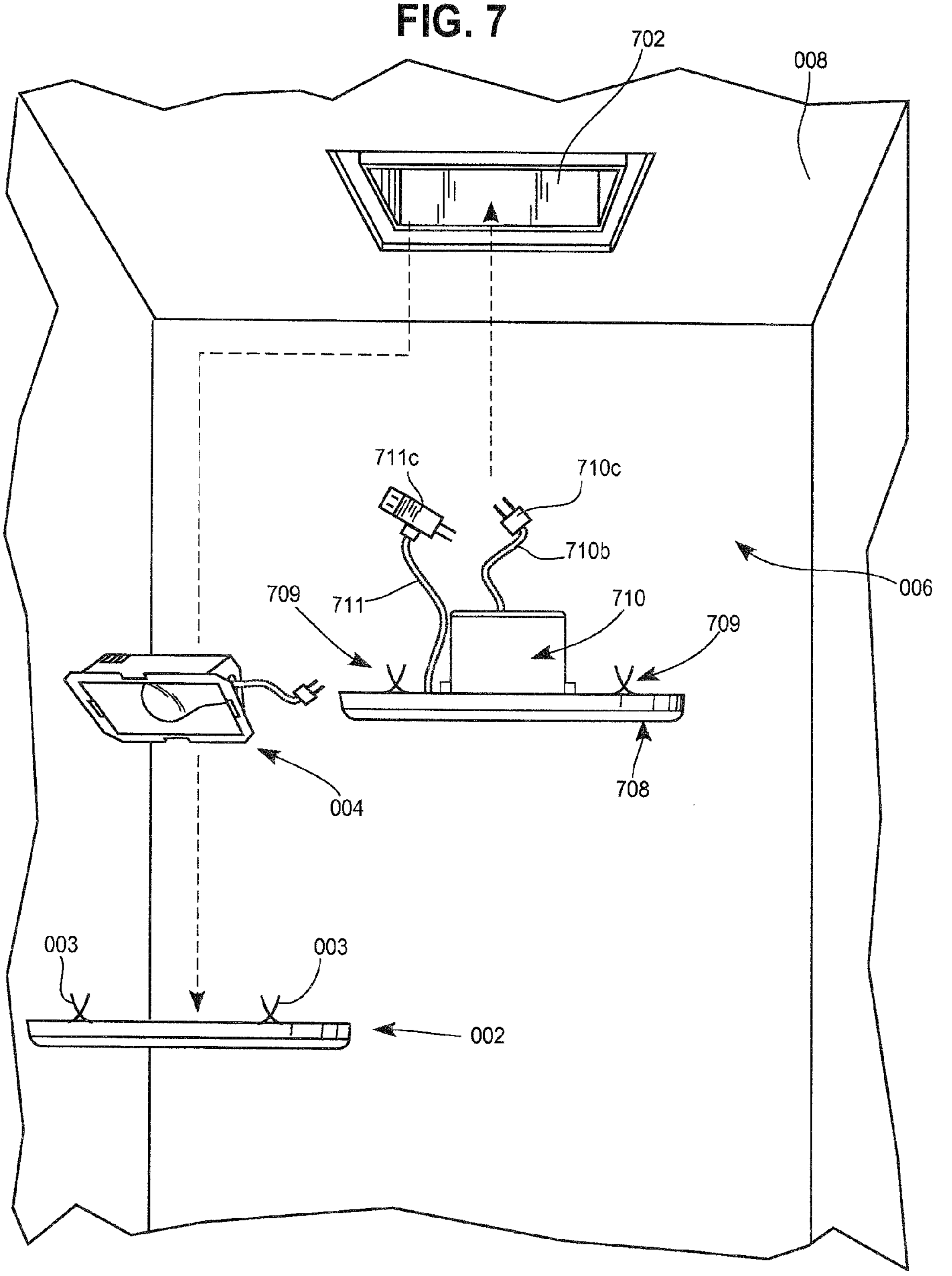
FIG. 7 illustrates a perspective view of a seventh embodiment.

In addition to providing complete fan assemblies like those discussed above, it is also contemplated that retro-fit kits may also be provided in accordance with the inventions disclosed herein. For example, in FIG. 7 a retro-fit kit is illustrated showing how an existing fan grille 002 may be removed from an existing fan housing 702 and replaced with an integrated grille and speaker assembly. More particularly, FIG. 7 illustrates a room 006 having a conventional fan with grille 002 and light 004. A user may remove the grille 002 by pulling down on the grille 002 away from ceiling 008 and then pinching the springs 003 to remove the springs 003 from their mating sockets in fan housing 702. The conventional grille 002 and light 004 may be replaced with a grille similar to that discussed above with respect to FIGS. 4A-C. As with the earlier embodiment, the grille 708 has an integrated speaker 710 connected to the grille 708 and a light assembly connected to a piggyback power cord 711 with a built-in power adapter 711*c*. When replacing the conventional grille 002 and light 004 with new grille 708, the user can connect the adapter plug 711*c* into the power outlet previously used for conventional light 004 and then connect plug 710*c* of speaker 710 into the outlet end of piggyback cord 711. The grille 708 can then be connected to the mating sockets of the fan housing 702 by pinch or compressing the distal ends of springs 709 and then pressing the grille 708 up to the ceiling 008.

Thus, with this configuration a user is able to retro-fit an older fan assembly with newer components and add features and/or functionality to the fan assembly. Specifically, the user is able to retro-fit the existing fan assembly with a newer grille 708 and light and add features/functionality by way of adding a speaker 710 to the fan assembly and room 006 and by replacing a less energy efficient incandescent light bulb with a more energy efficient LED light fixture. In other examples, a user can retro-fit an existing fan assembly without a light with a new grille and built-in speaker (e.g., hard-wired in, battery operated, etc.).

Figure 8:
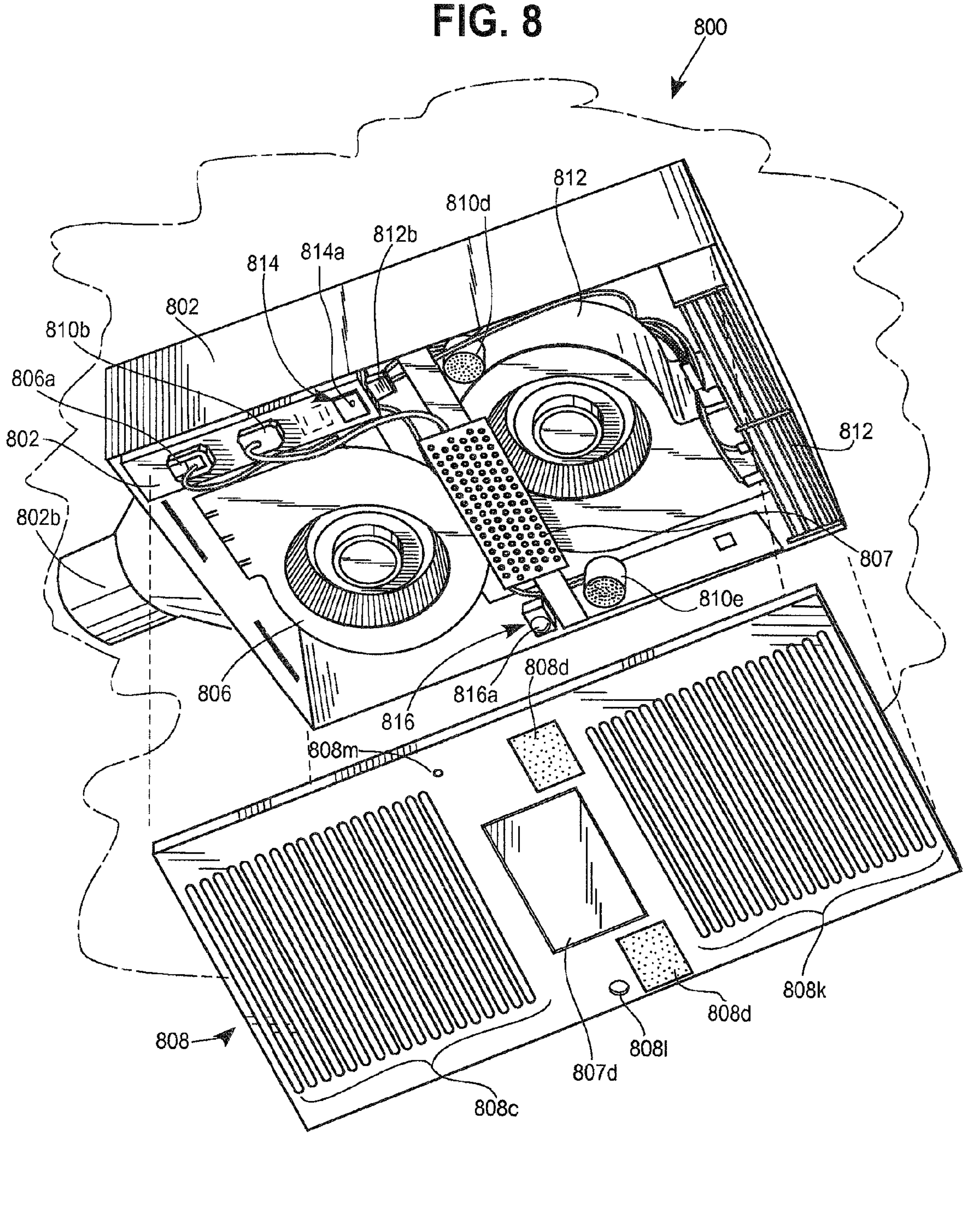
FIG. 8 illustrates a perspective view of an eighth embodiment.

Another fan assembly embodiment is illustrated in FIG. 8 showing additional features and functionality that can be provided in accordance with the invention disclosed herein. In keeping with prior practice, similar features to those discussed above will be referenced using the same two-digit reference numeral preceded with the prefix "8". In this embodiment, a fan assembly 800 is illustrated having a fan 806, light 807, dual speakers 810*d* and 810*e*, heater 812, humidity sensor 814 and motion detector 816. More particularly, the fan assembly 800 has a grille 808 with a first array of openings 808*c* for fan 806, a second set of openings 808*d* for speakers 810*d*, 810*e*, and a third array of openings 808*k* for heater 812. Although the fan 806 operates similar to those discussed above, the heater 812 operates a little differently. For example, rather than sucking air up through vents or baffles 808*k* and pushing the air out the side of the fan assembly housing 802 via duct work, the heater actually pulls air up through the vents or baffles located on one side of the third array of openings 808*k* (e.g., on the left side of 808*k* as depicted in FIG. 8) and blows this air over heating coils and out duct 812*a* and the opposite side of the third array of openings 808*k* (e.g., on the right side of 808*k* as depicted in FIG. 8). In a preferred form, a controller uses one or more thermocouples to monitor the temperature of the heated air blowing from duct 812*a* to adjust the heating coils to regulate and maintain the desired temperature of the blown air.

Fan assembly 800 further includes dual speakers 810*d*, 810*e* which are positioned on opposite sides of assembly housing 802. In the form illustrated speakers 810*d*, 810*e* are hard-wired to a power source, but with the motion detector 816 serving as the actuator for powering or turning on the speakers. Specifically, the motion detector 816 serves as either a signal generating device for signaling a controller to actuate the speakers 810*d*, 810*e* or as a normally open switch that automatically closes and activates the speakers when the detector 816 detects the presence of movement. In FIG. 8, motion detector 816 is a passive infrared detector that uses body heat or changes in heat to detect movement. It should be understood, however, that the motion detector 816 may be active or passive and may use any known technique for detecting movement (e.g., passive infrared, ultrasonic, microwave, tomographic, video, etc.). In the form illustrated, the grille 808 defines an opening 8081 through which the sensor 816*a* of motion detector 816 protrudes. In a preferred form, the sensor 816*a* is a dome type structure offering detection of heat in a three-hundred and sixty degree field of view. Although the embodiment shown illustrates the speakers being on the heater side of the fan assembly, it should be appreciated that in alternate embodiments, the speakers may be positioned on the fan side of the fan assembly and/or may be positioned in other locations on the fan assembly (e.g., in the corners, in alternate corners, etc.) if desired.

In addition to the motion detector 816, fan assembly 800 further includes a humidity sensor 814 which is used to detect humidity present in the surrounding area of the fan assembly 800 and for turning on the fan 806 when a threshold humidity level has been reached. Like the motion detector 816, the humidity sensor 814 may be setup to transmit a signal that a controller will use to determine when to actuate the fan 806, or it may be used as a normally open switch connected to the fan 806 that closes once the threshold humidity level has been detected, thereby actuating fan 806. In the form illustrated, the humidity sensor 814 includes an LED 814*a* that extends through opening 808*m* in grille 808 and is illuminated when the threshold humidity has been reached so that any individuals present will know that the fan assembly 800 has been activated because of the detection of a threshold humidity amount. However, it should be appreciated that in alternate embodiments, the LED 814*a* may be activated or illuminated in different manners to signify different things to individuals who are present. For example, the humidity sensor 814 could be configured to cause the LED 814*a* to blink when the threshold humidity has been reached and the fan has been activated. In other forms, the humidity sensor 814 may not be provided with an LED 814*a*.

The humidity sensor 814 may be used to automatically turn on and off the fan assembly 800 as needed. For example, the humidity sensor 814 may be used to activate the fan as mentioned above when a threshold humidity level has been detected and to deactivate the fan 800 when the humidity level has dropped below the threshold amount. In other forms, the humidity sensor's activation of the fan 800 may trigger a timer that allows the fan assembly 800 to operate for a predetermined period of time before deactivating the fan assembly 800. In still other forms, the humidity sensor 814 may be used to either constantly check humidity levels or periodically check humidity levels and to operate the fan once a threshold humidity level has been reached or surpassed. A humidity sensor is disclosed in published U.S. Patent Application No. 2011/0138908 A1 published to Liu et al. on Jun. 16, 2011, the disclosure of which is incorporate herein by reference.

Turning back to the fan assembly 800 of FIG. 8, the fan assembly 800 preferably includes a power strip 802 having one or more power outlets. In the form illustrated, the speakers 810*d* and 810*e*, motion detector 816 and humidity sensor 814 are all hard-wired to a power supply. However, the fan 806, blower 812 and light assembly 807 are all connected to the power strip 802 using conventional connectors for the particular region the assembly is installed in. Specifically, power cord or plug 806 connects fan 806 to power strip 802, power cord or plug 810*b* connects the light assembly 807 to power strip 802, and power cord 812*b* connects heater 812 to power strip 802. In a preferred form, three separate wall switches are provided with each actuating one of the fan 806, light assembly 807 and heater 812, while the speakers 810*d* and 810*e* are activated independently and automatically by the motion detector 814. In this configuration, three-way wiring and switching will be used for fan 806 so that either the wall switch or the humidity sensor is able to activate the fan 806.

It should be understood, however, that in alternate embodiments the fan assembly 800 may be wired in a variety of different manners. For example, if it is desired to have the fan and speakers go on at the same time, the fan and speakers could be wired together or a piggyback switch like the type discussed above could be used. Alternatively, the fan assembly could be designed so that the fan, heater, light and speakers are each independently operable via designated actuators or switches (with both speakers preferably being wired to one actuator or switch). In such an embodiment, the power strip 802 may include an additional outlet 802*a* which the speakers 810*d* and 810*e* may be connected to via a power cord that is controlled by a remote actuator such as a wall switch.

Figure 9A:
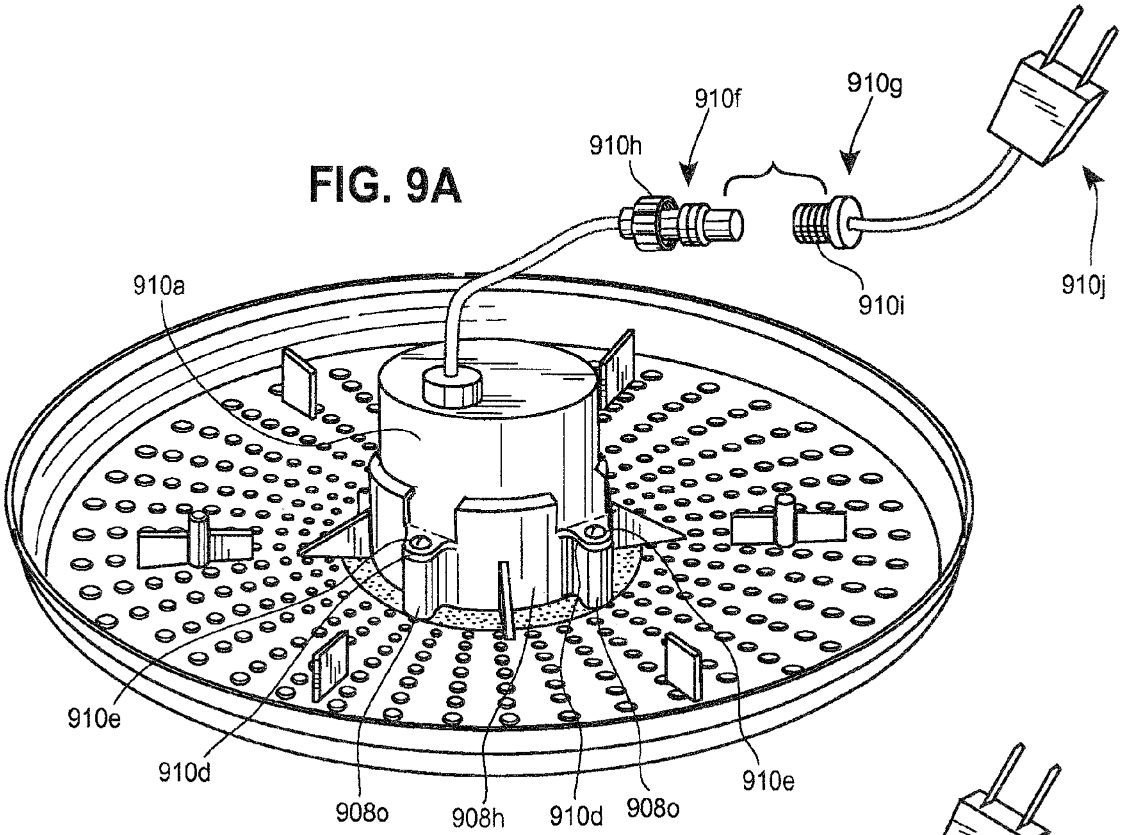
FIGS. 9A-B illustrate perspective views of a ninth embodiment.
Figure 9B:
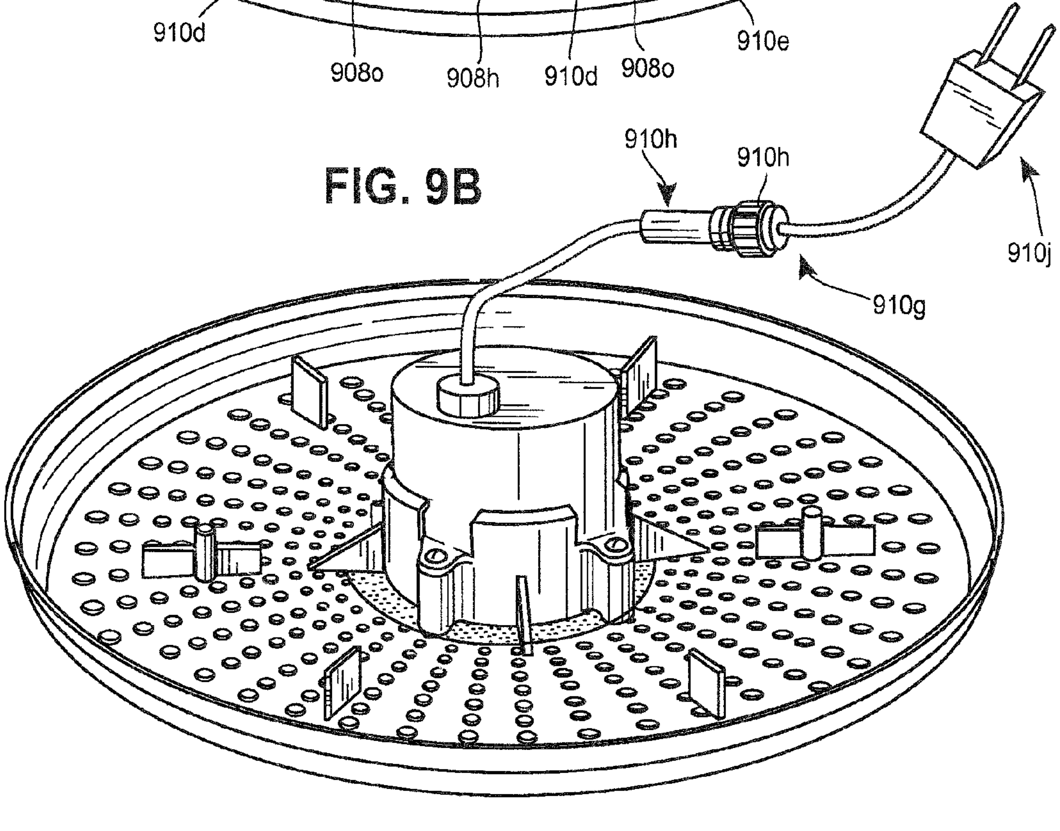

FIGS. 9A-B illustrate another embodiment in accordance with the invention. In keeping with prior practice features common with those discussed above will use the same two-digit reference numeral with the addition of the prefix "9" simply to distinguish one embodiment from the others. In the embodiment illustrated in FIG. 9, grille 908 and motor 904 are illustrated which are similar to those discussed above with respect to FIGS. 1A-4C. Unlike prior embodiments, however, the speaker 910 includes alignment tabs or projections 910*d* which align and mate with guides such as mating notches and bores, 908*n* and 908*o*, respectively. More particularly, the projections or male guide structures 910*d* extending outward from the cylindrical sidewall 910*a* of speaker 910 are aligned with corresponding notches or female guide structures 908*n* defined by grille mount 908*h*. In a preferred form, the male guide structures each have an opening that is aligned with a corresponding bore 908*o* defined by grille mount 908*h* when the male guide structures 910*d* are inserted into the mating female guide channels 908*n* defined by grille mount 908*h*. Once the speaker 910 is fully inserted into the grille mount 908*h*, the male guide structures 910*d* abut bores 908*o* such that the speaker 910 may be fastened to the grille mount 908*h* via fasteners such as screws 910*e*. This configuration allows the grille to be packed, shipped and handled more securely and makes it less likely that the speaker 910 will be inadvertently removed from grille 908.

In addition to the differences relating to how the speaker 910 is mounted in grille mount 908*h*, the speaker 910 also has a different power cord 910*b*. More particularly, the power cord 910*b* includes first and second connectors 910*f* and 910*g*, respectively. In a preferred form, these are mating quick connect/quick disconnect connectors. To connect, the first and second connectors 910*f* and 910*g* are connected with one another as shown in FIG. 9B and then a fastener, such as nut member 910*h*, is fastened to connect the first and second connectors 910*f* and 910*g* together so that they cannot inadvertently be removed from one another. More particularly, nut member 910*h* is thread onto the external threading 910*i* of second connector 910*f* to secure the two connectors 910*f*, 910*g* together. Then the plug 910*j* may be connected into a power outlet. As with above-mentioned embodiments, the plug 910*j* will preferably include an adapter for converting AC to DC to power the speaker 910.

It should be understood that in alternate embodiments different types of quick connect/quick disconnect connectors may be used. For example, in alternate embodiments insulation displacement connectors (or insulation piercing connectors or the like) may be used to allow the speaker and/or lighting to be quickly connected to existing wiring and/or wiring that is not setup with quick connect/quick disconnect terminals or connectors. Such insulation displacement connectors are particularly helpful in retro-fit applications where the speaker and/or light are being connected to an existing fan housing that does not have quick connect/quick disconnect connectors and/or may not even have a power outlet (such as, for example, if the fan grille being replaced did not have a light or an accompanying power outlet for a light).

Changes may be made to the embodiments disclosed herein while still operating within the concepts contemplated. For example, parts of different size, shape, location or number may be used, and/or various parts of one embodiment may be combined with other embodiments. For example, although some embodiments discussed herein mention using a sleeve configuration for mounting the speaker to the grille, it should be understood that in alternate embodiments any number of mating structures and fasteners may be used as is desired for a particular application. Similarly, in alternate embodiments different opening sizes, shapes and patterns may be used for the grille and/or grilles of different sizes and shapes may be used.

What is claimed is:

1. An audio equipped fan assembly comprising:

a housing defining an inner cavity;

a motor disposed at least partially in the inner cavity of the housing and having an output shaft extending therefrom that is rotatable by the motor;

a fan connected to the output shaft of the motor and rotatable therewith;

a grille connected to the housing and positioned in alignment with the fan, the grille having an interior side and an exterior side and defining first openings through which air may flow while the fan is rotated and second openings through which sound may travel; and a speaker connected to at least one of the housing, motor, fan and grille and aligned on the interior side of the grille with the second openings of the grille so that sound may travel from the speaker through the grille.

2. The audio equipped fan assembly of claim 1 wherein the speaker is connected to the grille and positioned along a central axis of the grille so that air may flow around the speaker and through the fan without interruption and sound can travel from the speaker located on the interior side of the grille, through the second openings to the exterior side of the grille.

3. The audio equipped fan assembly of claim 2 wherein the grille includes a mount for mounting the speaker in alignment with the second openings.

4. The audio equipped fan assembly of claim 3 wherein the speaker has a round housing portion and the grille mount includes an annular wall extending from the interior side of the grille and sized to receive the round housing portion of the speaker.

5. The audio equipped fan assembly of claim 4 wherein the round housing portion of the speaker has a first diameter and the annular wall of the grille mount defines an opening with a second diameter with the second diameter being slightly larger than the first diameter so that at least a portion of the round housing portion of the speaker may be disposed in the annular wall of the grille when the speaker is connected to the grille.

6. The audio equipped fan assembly of claim 4 wherein the round housing portion of the speaker is friction fit or snap fit into the grille mount to secure the speaker to the grille.

7. The audio equipped fan assembly of claim 1 wherein the speaker has a round housing portion with a first diameter and the second openings of the grille are positioned about a central axis of the grille in a circular pattern having a second diameter.

8. The audio equipped fan assembly of claim 7 wherein the first and second diameters are generally equal in size to one another.

9. The audio equipped fan assembly of claim 7 wherein the second diameter is larger than the first diameter.

10. The audio equipped fan assembly of claim 1 wherein the first and second openings maintain similar shapes or patterns over the grille.

11. The audio equipped fan assembly of claim 10 wherein the first openings decrease in size from an outer circumference of the grille to a central axis of the grille and the second openings maintain this pattern by being smaller in size than any of the first openings.

12. The audio equipped fan assembly of claim 1 wherein the first and second openings have distinct shapes or patterns so that the first and second openings can easily be distinguished from one another.

13. The audio equipped fan assembly of claim 12 wherein the grille further defines a border region between the first and second openings to distinguish the first and second openings from one another.

14. The audio equipped fan assembly of claim 1 wherein the speaker and motor share a common power source.

15. The audio equipped fan assembly of claim 14 wherein both the speaker and motor are powered via an AC power source and the speaker remains constantly powered so that the speaker can be used to transmit sound regardless of whether power is being supplied to the fan.

16. The audio equipped fan assembly of claim 1 wherein the speaker is battery operated and the motor is operated via an AC power source.

17. The audio equipped fan assembly of claim 1 wherein the speaker is connected to a network and capable of transmitting sound from an electronic device.

18. The audio equipped fan assembly of claim 17 wherein the network is a local area network and the speaker is a Bluetooth enabled speaker capable of playing music from an electronic device equipped with a Bluetooth transmitter.

19. The audio equipped fan assembly of claim 18 wherein the speaker is equipped with a Bluetooth transceiver and allows two-way communication between the speaker and the electronic device.

20. The audio equipped fan assembly of claim 19 further comprising a microphone associated with the transceiver so that the audio equipped fan assembly may be used to play music and conduct telecommunications.

21. The audio equipped fan assembly of claim 17 wherein the electronic device is at least one of a mobile electronic device, a computer or an intercom system.

22. The audio equipped fan assembly of claim 1 including a remotely controllable actuator for turning on and off the fan or speaker.

23. The audio equipped fan assembly of claim 22 wherein the actuator comprises a first actuator for turning on and off the fan and a second actuator separate from the first actuator for turning on and off the speaker so that the fan and speaker may be operated independent of one another.

24. The audio equipped fan assembly of claim 22 including a controller connected to the actuator for detecting power line communication via toggling of the actuator on and off.

25. The audio equipped fan assembly of claim 23 wherein toggling the actuator on and off a first number of times instructs the controller to turn on both the fan and the speaker, and toggling the actuator on and off a second number of times different than the first number of times instructs the controller to turn on the speaker only and not the fan.

26. The audio equipped fan assembly of claim 1 wherein the speaker is sealed to prevent or reduce exposure of the speaker to moisture.

27. The audio equipped fan assembly of claim 26 further comprising a transceiver and microphone connected to the speaker to allow for two-way communications between the audio equipped fan assembly and an electronic device, the transceiver and microphone being sealed to prevent or reduce exposure to moisture.

28. The audio equipped fan assembly of claim 1 wherein the speaker is positioned below the motor and fan and arranged to propagate sound waves downward and to avoid excessive transmission of sound waves upward.

29. The audio equipped fan assembly of claim 28 wherein the grille, speaker, motor and fan are aligned along a common central axis.

30. An audio equipped fan assembly supported on a ceiling in a room of a structure comprising:

a housing having an air inlet, an air outlet and an interior positioned between the inlet and outlet;

a motor and a fan driven by the motor, the fan being supported in the interior of the housing and being operable to move air from the room;

a grille connected to the housing and extending across the air inlet of the housing, having an interior side and an exterior side and defining a plurality of first openings through which air may flow while the fan is on and a plurality of second openings through which sound may travel; and a Bluetooth speaker disposed in the interior of the housing and aligned with the second openings to generate sound there through.

* * * * *